(12) United States Patent
Popovich et al.

(10) Patent No.: US 11,256,155 B2
(45) Date of Patent: Feb. 22, 2022

(54) CONTACT IMAGE SENSOR USING SWITCHABLE BRAGG GRATINGS

(71) Applicant: DigiLens Inc., Sunnyvale, CA (US)

(72) Inventors: Milan Momcilo Popovich, Leicester (GB); Jonathan David Waldern, Los Altos Hills, CA (US)

(73) Assignee: DigiLens Inc., Sunnyvale, CA (US)

( * ) Notice: Subject to any disclaimer, the term of this patent is extended or adjusted under 35 U.S.C. 154(b) by 0 days.

(21) Appl. No.: 16/664,659

(22) Filed: Oct. 25, 2019

(65) Prior Publication Data
US 2020/0081317 A1 Mar. 12, 2020

Related U.S. Application Data

(63) Continuation of application No. 16/281,969, filed on Feb. 21, 2019, now Pat. No. 10,459,311, which is a
(Continued)

(51) Int. Cl.
*G02F 1/295* (2006.01)
*G02B 6/26* (2006.01)
(Continued)

(52) U.S. Cl.
CPC ......... *G02F 1/292* (2013.01); *G02B 6/12002* (2013.01); *G02B 26/0808* (2013.01);
(Continued)

(58) Field of Classification Search
CPC ...... G02B 6/122; G02B 6/34; G02B 6/12004; G02B 6/12002; G02B 6/4204;
(Continued)

(56) References Cited

U.S. PATENT DOCUMENTS

| | | |
|---|---|---|
| 2,141,884 A | 12/1938 | Sonnefeld |
| 3,620,601 A | 11/1971 | Leonard et al. |

(Continued)

FOREIGN PATENT DOCUMENTS

| | | |
|---|---|---|
| CN | 200944140 Y | 9/2007 |
| CN | 101151562 A | 3/2008 |

(Continued)

OTHER PUBLICATIONS

International Preliminary Report on Patentability for International Application PCT/GB2015/000228, dated Feb. 14, 2017, dated Feb. 23, 2017, 11 pgs.
(Continued)

*Primary Examiner* — Kaveh C Kianni
*Assistant Examiner* — Hung Q Lam
(74) *Attorney, Agent, or Firm* — KPPB LLP

(57) ABSTRACT

A contact image sensor comprises: a light source providing a collimated beam; a detector and a switchable grating array comprising first and second transparent substrates sandwiching an array of switchable grating elements with transparent electrodes applied to said substrates, said substrates together providing a total internal reflection light guide. A first transmission grating layer overlays said first substrate. A second transmission grating layer overlays said second substrate. A quarter wavelength retarder layer overlays said second transmission grating layer. A platen overlays said quarter wavelength retarder layer; a polarization-rotating reflecting layer overlaying said first transmission grating layer. An input coupler for directing light from said light source into said light guide and an output coupler for extracting light out of said light guide towards said detector are also provided.

20 Claims, 18 Drawing Sheets

Related U.S. Application Data continuation of application No. 15/799,590, filed on Oct. 31, 2017, now Pat. No. 10,216,061, which is a continuation of application No. 14/370,887, filed as application No. PCT/GB2013/000005 on Jan. 7, 2013, now abandoned.

(60) Provisional application No. 61/629,587, filed on Jan. 6, 2012.

(51) Int. Cl.

| | | |
|---|---|---|
| *G02B 6/42* | (2006.01) | |
| *G02B 6/34* | (2006.01) | |
| *G02F 1/29* | (2006.01) | |
| *H01L 27/146* | (2006.01) | |
| *G02F 1/1334* | (2006.01) | |
| *G06F 3/042* | (2006.01) | |
| *G06K 9/00* | (2022.01) | |
| *G02B 26/08* | (2006.01) | |
| *G02B 27/42* | (2006.01) | |
| *G02B 6/12* | (2006.01) | |
| *F21V 8/00* | (2006.01) | |

(52) U.S. Cl.
CPC ..... *G02B 27/4277* (2013.01); *G02F 1/13342* (2013.01); *G06F 3/0421* (2013.01); *G06K 9/0004* (2013.01); *H01L 27/14618* (2013.01); *H01L 27/14625* (2013.01); *H01L 27/14678* (2013.01); *G02B 6/0076* (2013.01); *G02B 2006/12107* (2013.01); *G02B 2006/12138* (2013.01); *G02F 2201/307* (2013.01); *G02F 2203/62* (2013.01); *H01L 2924/0002* (2013.01)

(58) Field of Classification Search
CPC .......... G02B 2006/12107; G02B 26/00; G02B 26/0808; G02F 1/31; G02F 2201/307; G02F 1/292; G02F 1/13342; G06F 3/0421; G06K 9/0004; H01J 27/14618; H01J 27/14625; H01J 27/14678
USPC ...... 385/10, 14–16, 37, 40, 49, 50, 129–132
See application file for complete search history.

(56) References Cited

U.S. PATENT DOCUMENTS

| | | |
|---|---|---|
| 3,851,303 A | 11/1974 | Muller |
| 3,885,095 A | 5/1975 | Wolfson et al. |
| 3,940,204 A | 2/1976 | Withrington |
| 4,082,432 A | 4/1978 | Kirschner |
| 4,099,841 A | 7/1978 | Ellis |
| 4,178,074 A | 12/1979 | Heller |
| 4,218,111 A | 8/1980 | Withrington et al. |
| 4,232,943 A | 11/1980 | Rogers |
| 4,309,070 A | 1/1982 | St. Leger Searle |
| 4,647,967 A | 3/1987 | Kirschner et al. |
| 4,714,320 A | 12/1987 | Banbury |
| 4,743,083 A | 5/1988 | Schimpe |
| 4,749,256 A | 6/1988 | Bell et al. |
| 4,775,218 A | 10/1988 | Wood et al. |
| 4,799,765 A | 1/1989 | Ferrer |
| 4,854,688 A | 8/1989 | Hayford et al. |
| 4,928,301 A | 5/1990 | Smoot |
| 4,946,245 A | 8/1990 | Chamberlin et al. |
| 5,007,711 A | 4/1991 | Wood et al. |
| 5,016,953 A | 5/1991 | Moss et al. |
| 5,035,734 A | 7/1991 | Honkanen et al. |
| 5,076,664 A | 12/1991 | Migozzi |
| 5,079,416 A | 1/1992 | Filipovich |
| 5,109,465 A | 4/1992 | Klopotek |
| 5,117,285 A | 5/1992 | Nelson et al. |
| 5,150,234 A | 9/1992 | Takahashi et al. |
| 5,151,958 A | 9/1992 | Honkanen |
| 5,153,751 A | 10/1992 | Ishikawa et al. |
| 5,159,445 A | 10/1992 | Gitlin et al. |
| 5,160,523 A | 11/1992 | Honkanen et al. |
| 5,183,545 A | 2/1993 | Branca et al. |
| 5,187,597 A | 2/1993 | Kato et al. |
| 5,210,624 A | 5/1993 | Matsumoto et al. |
| 5,218,360 A | 6/1993 | Goetz et al. |
| 5,243,413 A | 9/1993 | Gitlin et al. |
| 5,289,315 A | 2/1994 | Makita et al. |
| 5,303,085 A | 4/1994 | Rallison |
| 5,317,405 A | 5/1994 | Kuriki et al. |
| 5,341,230 A | 8/1994 | Smith |
| 5,351,151 A | 9/1994 | Levy |
| 5,359,362 A | 10/1994 | Lewis et al. |
| 5,363,220 A | 11/1994 | Kuwayama et al. |
| 5,369,511 A | 11/1994 | Amos |
| 5,400,069 A | 3/1995 | Braun et al. |
| 5,408,346 A | 4/1995 | Trissel et al. |
| 5,410,370 A | 4/1995 | Janssen |
| 5,416,514 A | 5/1995 | Janssen et al. |
| 5,418,584 A | 5/1995 | Larson |
| 5,438,357 A | 8/1995 | McNelley |
| 5,471,326 A | 11/1995 | Hall et al. |
| 5,473,222 A | 12/1995 | Thoeny et al. |
| 5,496,621 A | 3/1996 | Makita et al. |
| 5,500,671 A | 3/1996 | Andersson et al. |
| 5,510,913 A | 4/1996 | Hashimoto et al. |
| 5,524,272 A | 6/1996 | Podowski et al. |
| 5,532,736 A | 7/1996 | Kuriki et al. |
| 5,537,232 A | 7/1996 | Biles |
| 5,572,248 A | 11/1996 | Allen et al. |
| 5,579,026 A | 11/1996 | Tabata |
| 5,583,795 A | 12/1996 | Smyth |
| 5,604,611 A | 2/1997 | Saburi et al. |
| 5,606,433 A | 2/1997 | Yin et al. |
| 5,612,733 A | 3/1997 | Flohr |
| 5,612,734 A | 3/1997 | Nelson et al. |
| 5,619,254 A | 4/1997 | McNelley |
| 5,629,259 A | 5/1997 | Akada et al. |
| 5,631,107 A | 5/1997 | Tarumi et al. |
| 5,633,100 A | 5/1997 | Mickish et al. |
| 5,646,785 A | 7/1997 | Gilboa et al. |
| 5,648,857 A | 7/1997 | Ando et al. |
| 5,661,577 A | 8/1997 | Jenkins et al. |
| 5,661,603 A | 8/1997 | Hanano et al. |
| 5,665,494 A | 9/1997 | Kawabata et al. |
| 5,668,907 A | 9/1997 | Veligdan |
| 5,694,230 A | 12/1997 | Welch |
| 5,701,132 A | 12/1997 | Kollin et al. |
| 5,706,108 A | 1/1998 | Ando et al. |
| 5,707,925 A | 1/1998 | Akada et al. |
| 5,724,189 A | 3/1998 | Ferrante |
| 5,726,782 A | 3/1998 | Kato et al. |
| 5,727,098 A | 3/1998 | Jacobson |
| 5,729,242 A | 3/1998 | Margerum et al. |
| 5,731,060 A | 3/1998 | Hirukawa et al. |
| 5,731,853 A | 3/1998 | Taketomi et al. |
| 5,742,262 A | 4/1998 | Tabata et al. |
| 5,760,931 A | 6/1998 | Saburi et al. |
| 5,764,414 A | 6/1998 | King et al. |
| 5,790,288 A | 8/1998 | Jager et al. |
| 5,812,608 A | 9/1998 | Valimaki et al. |
| 5,822,127 A | 10/1998 | Chen et al. |
| 5,841,507 A | 11/1998 | Barnes |
| 5,847,787 A | 12/1998 | Fredley et al. |
| 5,857,043 A | 1/1999 | Cook et al. |
| 5,868,951 A | 2/1999 | Schuck, III et al. |
| 5,886,822 A | 3/1999 | Spitzer |
| 5,892,598 A | 4/1999 | Asakawa et al. |
| 5,898,511 A | 4/1999 | Mizutani et al. |
| 5,903,395 A | 5/1999 | Rallison et al. |
| 5,903,396 A | 5/1999 | Rallison |
| 5,907,416 A | 5/1999 | Hegg et al. |
| 5,907,436 A | 5/1999 | Perry et al. |
| 5,917,459 A | 6/1999 | Son et al. |
| 5,926,147 A | 7/1999 | Sehm et al. |
| 5,929,946 A | 7/1999 | Sharp et al. |
| 5,945,893 A | 8/1999 | Plessky et al. |

(56) References Cited

U.S. PATENT DOCUMENTS

| | | |
|---|---|---|
| 5,949,302 A | 9/1999 | Sarkka |
| 5,962,147 A | 10/1999 | Shalhub et al. |
| 5,985,422 A | 11/1999 | Krauter |
| 5,991,087 A | 11/1999 | Rallison |
| 5,999,314 A | 12/1999 | Asakura et al. |
| 6,042,947 A | 3/2000 | Asakura et al. |
| 6,043,585 A | 3/2000 | Plessky et al. |
| 6,069,728 A | 5/2000 | Huignard et al. |
| 6,075,626 A | 6/2000 | Mizutani et al. |
| 6,078,427 A | 6/2000 | Fontaine et al. |
| 6,107,943 A | 8/2000 | Schroeder |
| 6,121,899 A | 9/2000 | Theriault |
| 6,127,066 A | 10/2000 | Ueda et al. |
| 6,137,630 A | 10/2000 | Tsou et al. |
| 6,176,837 B1 | 1/2001 | Foxlin |
| 6,185,016 B1 | 2/2001 | Popovich |
| 6,195,206 B1 | 2/2001 | Yona et al. |
| 6,222,297 B1 | 4/2001 | Perdue |
| 6,222,675 B1 | 4/2001 | Mall et al. |
| 6,222,971 B1 | 4/2001 | Veligdan et al. |
| 6,249,386 B1 | 6/2001 | Yona et al. |
| 6,259,423 B1 | 7/2001 | Tokito et al. |
| 6,259,559 B1 | 7/2001 | Kobayashi et al. |
| 6,285,813 B1 | 9/2001 | Schultz et al. |
| 6,317,083 B1 | 11/2001 | Johnson et al. |
| 6,317,227 B1 | 11/2001 | Mizutani et al. |
| 6,321,069 B1 | 11/2001 | Piirainen |
| 6,323,970 B1 | 11/2001 | Popovich |
| 6,323,989 B1 | 11/2001 | Jacobson et al. |
| 6,327,089 B1 | 12/2001 | Hosaki et al. |
| 6,333,819 B1 | 12/2001 | Svedenkrans |
| 6,340,540 B1 | 1/2002 | Ueda et al. |
| 6,351,333 B2 | 2/2002 | Araki et al. |
| 6,356,172 B1 | 3/2002 | Koivisto et al. |
| 6,356,674 B1 | 3/2002 | Davis et al. |
| 6,359,730 B2 | 3/2002 | Tervonen |
| 6,359,737 B1 | 3/2002 | Stringfellow |
| 6,366,369 B2 | 4/2002 | Ichikawa et al. |
| 6,366,378 B1 | 4/2002 | Tervonen et al. |
| 6,392,812 B1 | 5/2002 | Howard |
| 6,407,724 B2 | 6/2002 | Waldern et al. |
| 6,409,687 B1 | 6/2002 | Foxlin |
| 6,470,132 B1 | 10/2002 | Nousiainen et al. |
| 6,473,209 B1 | 10/2002 | Popovich |
| 6,486,997 B1 | 11/2002 | Bruzzone et al. |
| 6,504,518 B1 | 1/2003 | Kuwayama et al. |
| 6,524,771 B2 | 2/2003 | Maeda et al. |
| 6,545,778 B2 | 4/2003 | Ono et al. |
| 6,550,949 B1 | 4/2003 | Bauer et al. |
| 6,552,789 B1 | 4/2003 | Modro |
| 6,557,413 B2 | 5/2003 | Nieminen et al. |
| 6,567,014 B1 | 5/2003 | Hansen et al. |
| 6,583,873 B1 | 6/2003 | Goncharov et al. |
| 6,587,619 B1 | 7/2003 | Kinoshita |
| 6,598,987 B1 | 7/2003 | Parikka |
| 6,600,590 B2 | 7/2003 | Roddy et al. |
| 6,608,720 B1 | 8/2003 | Freeman |
| 6,611,253 B1 | 8/2003 | Cohen |
| 6,618,104 B1 | 9/2003 | Date et al. |
| 6,625,381 B2 | 9/2003 | Roddy et al. |
| 6,646,772 B1 | 11/2003 | Popovich et al. |
| 6,646,810 B2 | 11/2003 | Harter, Jr. et al. |
| 6,661,578 B2 | 12/2003 | Hedrick |
| 6,667,134 B1 | 12/2003 | Sutherland et al. |
| 6,674,578 B2 | 1/2004 | Sugiyama et al. |
| 6,677,086 B1 | 1/2004 | Sutehrland et al. |
| 6,686,815 B1 | 2/2004 | Mirshekarl-Syahkal et al. |
| 6,690,516 B2 | 2/2004 | Aritake et al. |
| 6,692,666 B2 | 2/2004 | Sutherland et al. |
| 6,699,407 B1 | 3/2004 | Sutehrland et al. |
| 6,706,086 B2 | 3/2004 | Emig et al. |
| 6,706,451 B1 | 3/2004 | Sutherland et al. |
| 6,721,096 B2 | 4/2004 | Bruzzone et al. |
| 6,741,189 B1 | 5/2004 | Gibbons, II et al. |
| 6,744,478 B1 | 6/2004 | Asakura et al. |
| 6,748,342 B1 | 6/2004 | Dickhaus |
| 6,750,941 B2 | 6/2004 | Satoh et al. |
| 6,750,995 B2 | 6/2004 | Dickson |
| 6,757,105 B2 | 6/2004 | Niv et al. |
| 6,771,403 B1 | 8/2004 | Endo et al. |
| 6,776,339 B2 | 8/2004 | Piikivi |
| 6,781,701 B1 | 8/2004 | Sweetser et al. |
| 6,844,212 B2 | 1/2005 | Bond et al. |
| 6,844,980 B2 | 1/2005 | He et al. |
| 6,847,274 B2 | 1/2005 | Salmela et al. |
| 6,853,491 B1 | 2/2005 | Ruhle et al. |
| 6,864,861 B2 | 3/2005 | Schehrer et al. |
| 6,864,927 B1 | 3/2005 | Cathey |
| 6,873,443 B1 | 3/2005 | Joubert et al. |
| 6,885,483 B2 | 4/2005 | Takada |
| 6,903,872 B2 | 6/2005 | Schrader |
| 6,909,345 B1 | 6/2005 | Salmela et al. |
| 6,917,375 B2 | 7/2005 | Akada et al. |
| 6,922,267 B2 | 7/2005 | Endo et al. |
| 6,926,429 B2 | 8/2005 | Barlow et al. |
| 6,940,361 B1 | 9/2005 | Jokio et al. |
| 6,943,788 B2 | 9/2005 | Tomono |
| 6,950,227 B2 | 9/2005 | Schrader |
| 6,951,393 B2 | 10/2005 | Koide |
| 6,952,312 B2 | 10/2005 | Weber et al. |
| 6,958,662 B1 | 10/2005 | Salmela et al. |
| 6,972,788 B1 | 12/2005 | Robertson et al. |
| 6,987,908 B2 | 1/2006 | Bond et al. |
| 7,003,187 B2 | 2/2006 | Frick et al. |
| 7,006,732 B2 | 2/2006 | Gunn, III et al. |
| 7,018,744 B2 | 3/2006 | Otaki et al. |
| 7,027,671 B2 | 4/2006 | Huck et al. |
| 7,034,748 B2 | 4/2006 | Kajiya |
| 7,046,439 B2 | 5/2006 | Kaminsky et al. |
| 7,053,735 B2 | 5/2006 | Salmela et al. |
| 7,053,991 B2 | 5/2006 | Sandusky |
| 7,058,434 B2 | 6/2006 | Wang et al. |
| 7,068,898 B2 | 6/2006 | Buretea et al. |
| 7,095,562 B1 | 8/2006 | Peng et al. |
| 7,101,048 B2 | 9/2006 | Travis |
| 7,110,184 B1 | 9/2006 | Yona et al. |
| 7,123,418 B2 | 10/2006 | Weber et al. |
| 7,126,418 B2 | 10/2006 | Hunton et al. |
| 7,126,583 B1 | 10/2006 | Breed |
| 7,132,200 B1 | 11/2006 | Ueda et al. |
| 7,151,246 B2 | 12/2006 | Fein et al. |
| 7,158,095 B2 | 1/2007 | Jenson et al. |
| 7,181,105 B2 | 2/2007 | Teramura et al. |
| 7,190,849 B2 | 3/2007 | Katase |
| 7,199,934 B2 | 4/2007 | Yamasaki |
| 7,205,960 B2 | 4/2007 | David |
| 7,205,964 B1 | 4/2007 | Yokoyama et al. |
| 7,212,175 B1 | 5/2007 | Magee et al. |
| 7,230,767 B2 | 6/2007 | Walck et al. |
| 7,242,527 B2 | 7/2007 | Spitzer et al. |
| 7,248,128 B2 | 7/2007 | Mattila et al. |
| 7,259,906 B1 | 8/2007 | Islam |
| 7,268,946 B2 | 9/2007 | Wang |
| 7,285,903 B2 | 10/2007 | Cull et al. |
| 7,286,272 B2 | 10/2007 | Mukawa |
| 7,289,069 B2 | 10/2007 | Ranta |
| 7,299,983 B2 | 11/2007 | Piikivi |
| 7,313,291 B2 | 12/2007 | Okhotnikov et al. |
| 7,319,573 B2 | 1/2008 | Nishiyama |
| 7,320,534 B2 | 1/2008 | Sugikawa et al. |
| 7,323,275 B2 | 1/2008 | Otaki et al. |
| 7,336,271 B2 | 2/2008 | Ozeki et al. |
| 7,339,737 B2 | 3/2008 | Urey et al. |
| 7,339,742 B2 | 3/2008 | Amitai et al. |
| 7,369,911 B1 | 5/2008 | Volant et al. |
| 7,375,870 B2 | 5/2008 | Schorpp |
| 7,394,865 B2 | 7/2008 | Borran et al. |
| 7,395,181 B2 | 7/2008 | Foxlin |
| 7,397,606 B1 | 7/2008 | Peng et al. |
| 7,401,920 B1 | 7/2008 | Kranz et al. |
| 7,404,644 B2 | 7/2008 | Evans et al. |
| 7,410,286 B2 | 8/2008 | Travis |
| 7,411,637 B2 | 8/2008 | Weiss |
| 7,415,173 B2 | 8/2008 | Kassamakov et al. |

(56) References Cited

U.S. PATENT DOCUMENTS

| | | |
|---|---|---|
| 7,433,116 B1 | 10/2008 | Islam |
| 7,436,568 B1 | 10/2008 | Kuykendall |
| 7,447,967 B2 | 11/2008 | Onggosanusi et al. |
| 7,466,994 B2 | 12/2008 | Pihlaja et al. |
| 7,479,354 B2 | 1/2009 | Ueda et al. |
| 7,480,215 B2 | 1/2009 | Makela et al. |
| 7,482,996 B2 | 1/2009 | Larson et al. |
| 7,483,604 B2 | 1/2009 | Levola |
| 7,492,512 B2 | 2/2009 | Niv et al. |
| 7,496,293 B2 | 2/2009 | Shamir et al. |
| 7,500,104 B2 | 3/2009 | Goland |
| 7,513,668 B1 | 4/2009 | Peng et al. |
| 7,525,448 B1 | 4/2009 | Wilson et al. |
| 7,528,385 B2 | 5/2009 | Volodin et al. |
| 7,545,429 B2 | 6/2009 | Travis |
| 7,550,234 B2 | 6/2009 | Otaki et al. |
| 7,567,372 B2 | 7/2009 | Schorpp |
| 7,570,429 B2 | 8/2009 | Maliah et al. |
| 7,572,555 B2 | 8/2009 | Takizawa et al. |
| 7,573,640 B2 | 8/2009 | Nivon et al. |
| 7,576,916 B2 | 8/2009 | Amitai |
| 7,579,119 B2 | 8/2009 | Ueda et al. |
| 7,588,863 B2 | 9/2009 | Takizawa et al. |
| 7,589,900 B1 | 9/2009 | Powell |
| 7,592,988 B2 | 9/2009 | Katase |
| 7,593,575 B2 | 9/2009 | Houle et al. |
| 7,597,447 B2 | 10/2009 | Larson et al. |
| 7,599,012 B2 | 10/2009 | Nakamura et al. |
| 7,600,893 B2 | 10/2009 | Laino et al. |
| 7,602,552 B1 | 10/2009 | Blumenfeld |
| 7,605,719 B1 | 10/2009 | Wenger et al. |
| 7,605,774 B1 | 10/2009 | Brandt et al. |
| 7,616,270 B2 | 11/2009 | Hirabayashi et al. |
| 7,617,022 B1 | 11/2009 | Wood et al. |
| 7,618,750 B2 | 11/2009 | Ueda et al. |
| 7,619,825 B1 | 11/2009 | Peng et al. |
| 7,629,086 B2 | 12/2009 | Otaki et al. |
| 7,639,911 B2 | 12/2009 | Lee et al. |
| 7,656,585 B1 | 2/2010 | Powell et al. |
| 7,660,047 B1 | 2/2010 | Travis et al. |
| 7,672,024 B2 | 3/2010 | Kuan |
| 7,675,021 B2 | 3/2010 | Lapstun |
| 7,710,654 B2 | 5/2010 | Ashkenazi et al. |
| 7,724,441 B2 | 5/2010 | Amitai |
| 7,724,442 B2 | 5/2010 | Amitai |
| 7,733,571 B1 | 6/2010 | Li |
| 7,733,572 B1 | 6/2010 | Brown et al. |
| 7,778,305 B2 | 8/2010 | Parriaux et al. |
| 7,778,508 B2 | 8/2010 | Hirayama |
| 7,847,235 B2 | 12/2010 | Krupkin et al. |
| 7,864,427 B2 | 1/2011 | Korenaga et al. |
| 7,865,080 B2 | 1/2011 | Hecker et al. |
| 7,872,804 B2 | 1/2011 | Moon et al. |
| 7,887,186 B2 | 2/2011 | Watanabe |
| 7,903,921 B2 | 3/2011 | Ostergard |
| 7,920,787 B2 | 4/2011 | Gentner et al. |
| 7,928,862 B1 | 4/2011 | Matthews |
| 7,944,428 B2 | 5/2011 | Travis |
| 7,961,117 B1 | 6/2011 | Zimmerman et al. |
| 7,969,644 B2 | 6/2011 | Tilleman et al. |
| 7,970,246 B2 | 6/2011 | Travis et al. |
| 7,976,208 B2 | 7/2011 | Travis |
| 7,984,884 B1 | 7/2011 | Iliev et al. |
| 7,999,982 B2 | 8/2011 | Endo et al. |
| 8,000,491 B2 | 8/2011 | Brodkin et al. |
| 8,004,765 B2 | 8/2011 | Amitai |
| 8,022,942 B2 | 9/2011 | Bathiche et al. |
| RE42,992 E | 12/2011 | David |
| 8,079,713 B2 | 12/2011 | Ashkenazi |
| 8,082,222 B2 | 12/2011 | Rangarajan et al. |
| 8,086,030 B2 | 12/2011 | Gordon et al. |
| 8,089,568 B1 | 1/2012 | Brown et al. |
| 8,120,548 B1 | 2/2012 | Barber |
| 8,132,976 B2 | 3/2012 | Odell et al. |
| 8,136,690 B2 | 3/2012 | Fang et al. |
| 8,137,981 B2 | 3/2012 | Andrew et al. |
| 8,149,086 B2 | 4/2012 | Klein et al. |
| 8,152,315 B2 | 4/2012 | Travis et al. |
| 8,159,752 B2 | 4/2012 | Wertheim et al. |
| 8,160,409 B2 | 4/2012 | Large |
| 8,186,874 B2 | 5/2012 | Sinbar et al. |
| 8,188,925 B2 | 5/2012 | DeJean |
| 8,189,263 B1 | 5/2012 | Wang et al. |
| 8,189,973 B2 | 5/2012 | Travis et al. |
| 8,199,803 B2 | 6/2012 | Hauske et al. |
| 8,253,914 B2 | 8/2012 | Kajiya et al. |
| 8,254,031 B2 | 8/2012 | Levola |
| 8,264,498 B1 | 9/2012 | Vanderkamp et al. |
| 8,295,710 B2 | 10/2012 | Marcus |
| 8,301,031 B2 | 10/2012 | Gentner et al. |
| 8,305,577 B2 | 11/2012 | Kivioja et al. |
| 8,306,423 B2 | 11/2012 | Gottwald et al. |
| 8,314,819 B2 | 11/2012 | Kimmel et al. |
| 8,321,810 B2 | 11/2012 | Heintze |
| 8,354,806 B2 | 1/2013 | Travis et al. |
| 8,384,694 B2 | 2/2013 | Powell et al. |
| 8,384,730 B1 | 2/2013 | Vanderkamp et al. |
| 8,398,242 B2 | 3/2013 | Yamamoto et al. |
| 8,403,490 B2 | 3/2013 | Sugiyama et al. |
| 8,427,439 B2 | 4/2013 | Larsen et al. |
| 8,432,363 B2 | 4/2013 | Saarikko et al. |
| 8,432,372 B2 | 4/2013 | Butler et al. |
| 8,447,365 B1 | 5/2013 | Imanuel |
| 8,472,119 B1 | 6/2013 | Kelly |
| 8,477,261 B2 | 7/2013 | Travis et al. |
| 8,491,121 B2 | 7/2013 | Tilleman et al. |
| 8,493,366 B2 | 7/2013 | Bathiche et al. |
| 8,508,848 B2 | 8/2013 | Saarikko |
| 8,578,038 B2 | 11/2013 | Kaikuranta et al. |
| 8,581,831 B2 | 11/2013 | Travis |
| 8,619,062 B2 | 12/2013 | Powell et al. |
| 8,633,786 B2 | 1/2014 | Ermolov et al. |
| 8,634,139 B1 | 1/2014 | Brown et al. |
| 8,643,691 B2 | 2/2014 | Rosenfeld et al. |
| 8,670,029 B2 | 3/2014 | McEldowney |
| 8,693,087 B2 | 4/2014 | Nowatzyk et al. |
| 8,736,802 B2 | 5/2014 | Kajiya et al. |
| 8,742,952 B1 | 6/2014 | Bold |
| 8,749,886 B2 | 6/2014 | Gupta |
| 8,749,890 B1 | 6/2014 | Wood et al. |
| 8,767,294 B2 | 7/2014 | Chen et al. |
| 8,810,600 B2 | 8/2014 | Bohn et al. |
| 8,814,691 B2 | 8/2014 | Haddick et al. |
| 8,816,578 B1 | 8/2014 | Peng et al. |
| 8,830,143 B1 | 9/2014 | Pitchford et al. |
| 8,830,588 B1 | 9/2014 | Brown et al. |
| 8,885,112 B2 | 11/2014 | Popovich et al. |
| 8,913,324 B2 | 12/2014 | Schrader |
| 8,937,772 B1 | 1/2015 | Burns et al. |
| 8,938,141 B2 | 1/2015 | Magnusson |
| 9,097,890 B2 | 8/2015 | Miller et al. |
| 9,176,324 B1 | 11/2015 | Scherer et al. |
| 9,244,275 B1 | 1/2016 | Li |
| 9,244,280 B1 | 1/2016 | Tiana et al. |
| 9,244,281 B1 | 1/2016 | Zimmerman et al. |
| 9,253,359 B2 | 2/2016 | Takahashi |
| 9,274,339 B1 | 3/2016 | Brown et al. |
| 9,335,604 B2 | 5/2016 | Popovich et al. |
| 9,366,864 B1 | 6/2016 | Brown et al. |
| 9,377,852 B1 | 6/2016 | Shapiro et al. |
| 9,429,692 B1 | 8/2016 | Saarikko et al. |
| 9,456,744 B2 | 10/2016 | Popovich et al. |
| 9,464,779 B2 | 10/2016 | Popovich et al. |
| 9,465,227 B2 | 10/2016 | Popovich et al. |
| 9,507,150 B1 | 11/2016 | Stratton et al. |
| 9,513,480 B2 | 12/2016 | Saarikko et al. |
| 9,516,193 B2 | 12/2016 | Aramaki |
| 9,519,089 B1 | 12/2016 | Brown et al. |
| 9,523,852 B1 | 12/2016 | Brown et al. |
| 9,535,253 B2 | 1/2017 | Levola et al. |
| 9,541,763 B1 | 1/2017 | Heberlein et al. |
| 9,599,813 B1 | 3/2017 | Stratton et al. |
| 9,635,352 B1 | 4/2017 | Henry et al. |
| 9,648,313 B1 | 5/2017 | Henry et al. |

(56) References Cited

U.S. PATENT DOCUMENTS

| | | |
|---|---|---|
| 9,674,413 B1 | 6/2017 | Tiana et al. |
| 9,678,345 B1 | 6/2017 | Melzer et al. |
| 9,679,367 B1 | 6/2017 | Wald |
| 9,715,067 B1 | 7/2017 | Brown et al. |
| 9,715,110 B1 | 7/2017 | Brown et al. |
| 9,726,540 B2 | 8/2017 | Popovich et al. |
| 9,733,475 B1 | 8/2017 | Brown et al. |
| 9,754,507 B1 | 9/2017 | Wenger et al. |
| 9,762,895 B1 | 9/2017 | Henry et al. |
| 9,766,465 B1 | 9/2017 | Tiana et al. |
| 9,785,231 B1 | 10/2017 | Zimmerman |
| 9,791,694 B1 | 10/2017 | Haverkamp et al. |
| 9,804,389 B2 | 10/2017 | Popovich et al. |
| 9,874,931 B1 | 1/2018 | Koenck et al. |
| 9,933,684 B2 | 4/2018 | Brown et al. |
| 9,977,247 B1 | 5/2018 | Brown et al. |
| 10,156,681 B2 | 12/2018 | Waldern et al. |
| 10,185,154 B2 | 1/2019 | Popovich et al. |
| 10,209,517 B2 | 2/2019 | Popovich et al. |
| 10,216,061 B2 | 2/2019 | Popovich et al. |
| 10,234,696 B2 | 3/2019 | Popovich et al. |
| 10,241,330 B2 | 3/2019 | Popovich et al. |
| 10,330,777 B2 | 6/2019 | Popovich et al. |
| 10,359,736 B2 | 7/2019 | Popovich et al. |
| 10,409,144 B2 | 9/2019 | Popovich et al. |
| 10,423,813 B2 | 9/2019 | Popovich et al. |
| 10,459,311 B2 | 10/2019 | Popovich et al. |
| 10,527,797 B2 | 1/2020 | Waldern et al. |
| 10,591,756 B2 | 3/2020 | Popovich et al. |
| 10,747,982 B2 | 8/2020 | Popovich et al. |
| 2001/0024177 A1 | 9/2001 | Popovich |
| 2002/0012064 A1 | 1/2002 | Yamaguchi |
| 2002/0021461 A1 | 2/2002 | Ono et al. |
| 2002/0075240 A1 | 6/2002 | Lieberman et al. |
| 2002/0093701 A1 | 7/2002 | Zhang et al. |
| 2002/0127497 A1 | 9/2002 | Brown et al. |
| 2002/0131175 A1 | 9/2002 | Yagi et al. |
| 2003/0030912 A1 | 2/2003 | Gleckman et al. |
| 2003/0039442 A1 | 2/2003 | Bond et al. |
| 2003/0063042 A1 | 4/2003 | Friesem et al. |
| 2003/0149346 A1 | 8/2003 | Arnone et al. |
| 2003/0175004 A1 | 9/2003 | Garito et al. |
| 2003/0197154 A1 | 10/2003 | Manabe et al. |
| 2003/0228019 A1 | 12/2003 | Eichler et al. |
| 2004/0004989 A1 | 1/2004 | Shigeoka |
| 2004/0012833 A1 | 1/2004 | Newswanger et al. |
| 2004/0130797 A1 | 7/2004 | Leigh |
| 2004/0156008 A1 | 8/2004 | Reznikov et al. |
| 2004/0174348 A1 | 9/2004 | David |
| 2004/0188617 A1 | 9/2004 | Devitt et al. |
| 2004/0208446 A1 | 10/2004 | Bond et al. |
| 2004/0208466 A1 | 10/2004 | Mossberg et al. |
| 2004/0225025 A1 | 11/2004 | Sullivan et al. |
| 2005/0135747 A1 | 6/2005 | Greiner et al. |
| 2005/0136260 A1 | 6/2005 | Garcia |
| 2005/0218377 A1 | 10/2005 | Lawandy |
| 2005/0231774 A1 | 10/2005 | Hayashi et al. |
| 2005/0259217 A1 | 11/2005 | Lin et al. |
| 2005/0259302 A9 | 11/2005 | Metz et al. |
| 2005/0259944 A1 | 11/2005 | Anderson et al. |
| 2005/0269481 A1 | 12/2005 | David et al. |
| 2006/0002274 A1 | 1/2006 | Kihara et al. |
| 2006/0013977 A1 | 1/2006 | Duke et al. |
| 2006/0055993 A1 | 3/2006 | Kobayashi et al. |
| 2006/0093793 A1 | 5/2006 | Miyakawa et al. |
| 2006/0114564 A1 | 6/2006 | Sutherland et al. |
| 2006/0119916 A1 | 6/2006 | Sutherland et al. |
| 2006/0126179 A1 | 6/2006 | Levola |
| 2006/0142455 A1 | 6/2006 | Agarwal et al. |
| 2006/0159864 A1 | 7/2006 | Natarajan et al. |
| 2006/0164593 A1 | 7/2006 | Peyghambarian et al. |
| 2006/0177180 A1 | 8/2006 | Tazawa et al. |
| 2006/0181683 A1 | 8/2006 | Bhowmik et al. |
| 2006/0221063 A1 | 10/2006 | Ishihara |
| 2006/0221448 A1 | 10/2006 | Nivon et al. |
| 2006/0279662 A1 | 12/2006 | Kapellner et al. |
| 2006/0291021 A1 | 12/2006 | Mukawa |
| 2007/0019297 A1 | 1/2007 | Stewart et al. |
| 2007/0045596 A1 | 3/2007 | King et al. |
| 2007/0052929 A1 | 3/2007 | Allman et al. |
| 2007/0070504 A1 | 3/2007 | Akutsu et al. |
| 2007/0089625 A1 | 4/2007 | Grinberg et al. |
| 2007/0116409 A1 | 5/2007 | Bryan et al. |
| 2007/0133920 A1 | 6/2007 | Lee et al. |
| 2007/0133983 A1 | 6/2007 | Traff |
| 2007/0182915 A1 | 8/2007 | Osawa et al. |
| 2007/0188837 A1 | 8/2007 | Shimizu et al. |
| 2007/0211164 A1 | 9/2007 | Olsen et al. |
| 2008/0001909 A1 | 1/2008 | Lim |
| 2008/0089073 A1 | 4/2008 | Hikmet |
| 2008/0136916 A1 | 6/2008 | Wolff |
| 2008/0136923 A1 | 6/2008 | Inbar et al. |
| 2008/0151379 A1 | 6/2008 | Amitai |
| 2008/0186604 A1 | 8/2008 | Amitai |
| 2008/0278812 A1 | 11/2008 | Amitai |
| 2008/0285140 A1 | 11/2008 | Amitai |
| 2008/0297807 A1 | 12/2008 | Feldman et al. |
| 2008/0309586 A1 | 12/2008 | Vitale |
| 2009/0017424 A1 | 1/2009 | Yoeli et al. |
| 2009/0019222 A1 | 1/2009 | Verma et al. |
| 2009/0052017 A1 | 2/2009 | Sasaki |
| 2009/0052046 A1 | 2/2009 | Amitai |
| 2009/0067774 A1 | 3/2009 | Magnusson |
| 2009/0097122 A1 | 4/2009 | Niv |
| 2009/0097127 A1 | 4/2009 | Amitai |
| 2009/0121301 A1 | 5/2009 | Chang |
| 2009/0122413 A1 | 5/2009 | Hoffman et al. |
| 2009/0122414 A1 | 5/2009 | Amitai |
| 2009/0128902 A1 | 5/2009 | Niv et al. |
| 2009/0136246 A1 | 5/2009 | Murakami |
| 2009/0153437 A1 | 6/2009 | Aharoni |
| 2009/0169152 A1 | 7/2009 | Oestergard |
| 2009/0213208 A1 | 8/2009 | Glatt |
| 2009/0237804 A1 | 9/2009 | Amitai et al. |
| 2009/0316246 A1 | 12/2009 | Asai et al. |
| 2010/0060551 A1 | 3/2010 | Sugiyama et al. |
| 2010/0060990 A1 | 3/2010 | Wertheim et al. |
| 2010/0065726 A1 | 3/2010 | Zhong et al. |
| 2010/0092124 A1 | 4/2010 | Magnusson et al. |
| 2010/0096562 A1 | 4/2010 | Klunder et al. |
| 2010/0135615 A1 | 6/2010 | Ho et al. |
| 2010/0136319 A1 | 6/2010 | Imai et al. |
| 2010/0141555 A1 | 6/2010 | Rorberg et al. |
| 2010/0165465 A1 | 7/2010 | Levola |
| 2010/0165660 A1 | 7/2010 | Weber et al. |
| 2010/0171680 A1 | 7/2010 | Lapidot et al. |
| 2010/0177388 A1 | 7/2010 | Cohen et al. |
| 2010/0202725 A1 | 8/2010 | Popovich et al. |
| 2010/0214659 A1 | 8/2010 | Levola |
| 2010/0231693 A1 | 9/2010 | Levola |
| 2010/0231705 A1 | 9/2010 | Yahav et al. |
| 2010/0232003 A1 | 9/2010 | Baldy et al. |
| 2010/0246993 A1 | 9/2010 | Rieger et al. |
| 2010/0265117 A1 | 10/2010 | Weiss |
| 2010/0277803 A1 | 11/2010 | Pockett et al. |
| 2010/0296163 A1 | 11/2010 | Saarikko |
| 2010/0299814 A1 | 12/2010 | Celona et al. |
| 2010/0315719 A1 | 12/2010 | Saarikko et al. |
| 2010/0322555 A1 | 12/2010 | Vermeulen et al. |
| 2011/0001895 A1 | 1/2011 | Dahl |
| 2011/0002143 A1 | 1/2011 | Saarikko et al. |
| 2011/0013423 A1 | 1/2011 | Selbrede et al. |
| 2011/0019250 A1 | 1/2011 | Aiki et al. |
| 2011/0026774 A1 | 2/2011 | Flohr et al. |
| 2011/0038024 A1 | 2/2011 | Wang et al. |
| 2011/0050548 A1 | 3/2011 | Blumenfeld et al. |
| 2011/0063604 A1* | 3/2011 | Hamre .............. G06K 9/0004 356/71 |
| 2011/0096401 A1 | 4/2011 | Levola |
| 2011/0157707 A1 | 6/2011 | Tilleman et al. |
| 2011/0164221 A1 | 7/2011 | Tilleman et al. |
| 2011/0211239 A1 | 9/2011 | Mukawa et al. |
| 2011/0235365 A1 | 9/2011 | McCollum et al. |
| 2011/0238399 A1 | 9/2011 | Ophir et al. |

(56) References Cited

U.S. PATENT DOCUMENTS

| | | |
|---|---|---|
| 2011/0242349 A1 | 10/2011 | Izuha et al. |
| 2011/0299075 A1 | 12/2011 | Meade et al. |
| 2011/0310356 A1 | 12/2011 | Vallius |
| 2012/0007979 A1 | 1/2012 | Schneider et al. |
| 2012/0027347 A1 | 2/2012 | Mathal et al. |
| 2012/0067864 A1 | 3/2012 | Kusuda et al. |
| 2012/0099203 A1 | 4/2012 | Boubis et al. |
| 2012/0105634 A1 | 5/2012 | Meidan et al. |
| 2012/0127577 A1 | 5/2012 | Desserouer |
| 2012/0162764 A1 | 6/2012 | Shimizu |
| 2012/0176665 A1 | 7/2012 | Song et al. |
| 2012/0218481 A1 | 8/2012 | Popovich et al. |
| 2012/0224062 A1 | 9/2012 | Lacoste et al. |
| 2012/0235884 A1 | 9/2012 | Miller et al. |
| 2012/0235900 A1 | 9/2012 | Border et al. |
| 2012/0242661 A1 | 9/2012 | Takagi et al. |
| 2012/0280956 A1 | 11/2012 | Yamamoto et al. |
| 2012/0281943 A1 | 11/2012 | Popovich et al. |
| 2012/0294037 A1 | 11/2012 | Holman et al. |
| 2012/0320460 A1 | 12/2012 | Levola |
| 2013/0016362 A1 | 1/2013 | Gong et al. |
| 2013/0051730 A1 | 2/2013 | Travers et al. |
| 2013/0093893 A1 | 4/2013 | Schofield et al. |
| 2013/0101253 A1 | 4/2013 | Popovich et al. |
| 2013/0138275 A1 | 5/2013 | Nauman et al. |
| 2013/0141937 A1 | 6/2013 | Katsuta et al. |
| 2013/0170031 A1 | 7/2013 | Bohn et al. |
| 2013/0184904 A1 | 7/2013 | Gadzinski |
| 2013/0200710 A1 | 8/2013 | Robbins |
| 2013/0249895 A1 | 9/2013 | Westerinen et al. |
| 2013/0257848 A1 | 10/2013 | Westerinen et al. |
| 2013/0258701 A1 | 10/2013 | Westerinen et al. |
| 2013/0305437 A1 | 11/2013 | Weller et al. |
| 2013/0312811 A1 | 11/2013 | Aspnes et al. |
| 2013/0314793 A1 | 11/2013 | Robbins et al. |
| 2013/0328948 A1 | 12/2013 | Kunkel et al. |
| 2014/0009809 A1 | 1/2014 | Pyun et al. |
| 2014/0027006 A1 | 1/2014 | Foley et al. |
| 2014/0037242 A1 | 2/2014 | Popovich et al. |
| 2014/0043689 A1 | 2/2014 | Mason |
| 2014/0104685 A1 | 4/2014 | Bohn et al. |
| 2014/0152778 A1 | 6/2014 | Ihlenburg et al. |
| 2014/0168055 A1 | 6/2014 | Smith |
| 2014/0168260 A1 | 6/2014 | O'Brien et al. |
| 2014/0172296 A1 | 6/2014 | Shtukater |
| 2014/0268353 A1 | 9/2014 | Fujimura et al. |
| 2015/0086907 A1 | 3/2015 | Mizuta et al. |
| 2015/0107671 A1 | 4/2015 | Bodan et al. |
| 2015/0109763 A1 | 4/2015 | Shinkai et al. |
| 2015/0125109 A1 | 5/2015 | Robbins et al. |
| 2015/0160529 A1 | 6/2015 | Popovich et al. |
| 2015/0167868 A1 | 6/2015 | Boncha |
| 2015/0177686 A1 | 6/2015 | Lee et al. |
| 2015/0177688 A1 | 6/2015 | Popovich et al. |
| 2015/0219834 A1 | 8/2015 | Nichol et al. |
| 2015/0243068 A1 | 8/2015 | Solomon |
| 2015/0247975 A1 | 9/2015 | Abovitz et al. |
| 2015/0285682 A1 | 10/2015 | Popovich et al. |
| 2015/0289762 A1 | 10/2015 | Popovich et al. |
| 2015/0309264 A1 | 10/2015 | Abovitz et al. |
| 2015/0316768 A1 | 11/2015 | Simmonds |
| 2016/0209657 A1 | 7/2016 | Popovich et al. |
| 2016/0231570 A1 | 8/2016 | Levola et al. |
| 2016/0291328 A1 | 10/2016 | Popovich et al. |
| 2016/0336033 A1 | 11/2016 | Tanaka |
| 2017/0010466 A1 | 1/2017 | Klug et al. |
| 2017/0031160 A1 | 2/2017 | Popovich et al. |
| 2017/0032166 A1 | 2/2017 | Raguin et al. |
| 2017/0052374 A1 | 2/2017 | Waldern et al. |
| 2017/0059775 A1 | 3/2017 | Coles et al. |
| 2017/0160546 A1 | 6/2017 | Bull et al. |
| 2017/0212295 A1 | 7/2017 | Vasylyev |
| 2017/0255257 A1 | 9/2017 | Tiana et al. |
| 2017/0276940 A1 | 9/2017 | Popovich et al. |
| 2017/0356801 A1 | 12/2017 | Popovich et al. |
| 2018/0011324 A1 | 1/2018 | Popovich et al. |
| 2018/0059305 A1 | 3/2018 | Popovich et al. |
| 2018/0120669 A1 | 5/2018 | Popovich et al. |
| 2018/0143449 A1 | 5/2018 | Popovich et al. |
| 2018/0188542 A1 | 7/2018 | Waldern et al. |
| 2018/0210198 A1 | 7/2018 | Brown et al. |
| 2018/0210396 A1 | 7/2018 | Popovich et al. |
| 2018/0232048 A1 | 8/2018 | Popovich et al. |
| 2018/0246354 A1 | 8/2018 | Popovich et al. |
| 2018/0275402 A1 | 9/2018 | Popovich et al. |
| 2018/0284440 A1 | 10/2018 | Popovich et al. |
| 2018/0373115 A1 | 12/2018 | Brown et al. |
| 2019/0042827 A1 | 2/2019 | Popovich et al. |
| 2019/0064735 A1 | 2/2019 | Waldern et al. |
| 2019/0072723 A1 | 3/2019 | Waldern et al. |
| 2019/0113751 A9 | 4/2019 | Waldern et al. |
| 2019/0113829 A1 | 4/2019 | Waldern et al. |
| 2019/0121027 A1 | 4/2019 | Popovich et al. |
| 2019/0129085 A1 | 5/2019 | Waldern et al. |
| 2019/0187538 A1 | 6/2019 | Popovich et al. |
| 2019/0212195 A9 | 7/2019 | Popovich et al. |
| 2019/0212588 A1 | 7/2019 | Waldern et al. |
| 2019/0212589 A1 | 7/2019 | Waldern et al. |
| 2019/0212596 A1 | 7/2019 | Waldern et al. |
| 2019/0212597 A1 | 7/2019 | Waldern et al. |
| 2019/0212698 A1 | 7/2019 | Waldern et al. |
| 2019/0212699 A1 | 7/2019 | Waldern et al. |
| 2019/0219822 A1 | 7/2019 | Popovich et al. |
| 2020/0012839 A1 | 1/2020 | Popovich et al. |
| 2020/0026074 A1 | 1/2020 | Waldern et al. |
| 2020/0142131 A1 | 5/2020 | Waldern et al. |
| 2020/0150469 A1 | 5/2020 | Popovich et al. |
| 2020/0264378 A1 | 8/2020 | Grant et al. |
| 2020/0372236 A1 | 11/2020 | Popovich et al. |
| 2021/0063634 A1 | 3/2021 | Waldern et al. |

FOREIGN PATENT DOCUMENTS

| | | |
|---|---|---|
| CN | 101263412 A | 9/2008 |
| CN | 101589326 A | 11/2009 |
| CN | 101688977 A | 3/2010 |
| CN | 101881936 A | 11/2010 |
| CN | 102314092 A | 1/2012 |
| CN | 103777282 A | 5/2014 |
| CN | 103823267 A | 5/2014 |
| CN | 108474945 A | 8/2018 |
| CN | 108780224 A | 11/2018 |
| CN | 109154717 A | 1/2019 |
| CN | 103823267 B | 5/2019 |
| CN | 110383117 A | 10/2019 |
| CN | 107466372 B | 1/2021 |
| DE | 102006003785 A1 | 7/2007 |
| DE | 102013209436 A1 | 11/2014 |
| EP | 0822441 A2 | 2/1998 |
| EP | 1347641 A1 | 9/2003 |
| EP | 2225592 A1 | 9/2010 |
| EP | 2381290 A1 | 10/2011 |
| EP | 2748670 A1 | 7/2014 |
| EP | 2995986 B1 | 4/2017 |
| EP | 3359999 A1 | 8/2018 |
| EP | 2494388 B1 | 11/2018 |
| EP | 3433658 A1 | 1/2019 |
| EP | 3433659 A1 | 1/2019 |
| EP | 3548939 A2 | 10/2019 |
| FR | 2677463 A1 | 12/1992 |
| GB | 2115178 A | 9/1983 |
| JP | 2000511306 A | 8/2000 |
| JP | 2000261706 A | 9/2000 |
| JP | 2002529790 A | 9/2002 |
| JP | 2004157245 A | 6/2004 |
| JP | 2006350129 A | 12/2006 |
| JP | 2007011057 A | 1/2007 |
| JP | 2007219106 A | 8/2007 |
| JP | 2009515225 A | 4/2009 |
| JP | 2009133999 A | 6/2009 |
| JP | 2010044326 A | 2/2010 |
| JP | 2013061480 A | 4/2013 |
| JP | 2013235256 A | 11/2013 |
| JP | 2014132328 A | 7/2014 |

(56) References Cited

FOREIGN PATENT DOCUMENTS

| | | |
|---|---|---|
| JP | 2015053163 A | 3/2015 |
| JP | 2015523586 A | 8/2015 |
| JP | 2015172713 A | 10/2015 |
| JP | 2018533069 A | 11/2018 |
| JP | 2019512745 A | 5/2019 |
| JP | 2019520595 A | 7/2019 |
| JP | 6680793 B2 | 3/2020 |
| JP | 2020514783 A | 5/2020 |
| KR | 20060132474 A | 12/2006 |
| WO | 1998004650 A1 | 2/1998 |
| WO | 1999052002 A1 | 10/1999 |
| WO | 2000023832 A1 | 4/2000 |
| WO | 2000028369 A2 | 5/2000 |
| WO | 2000028369 A3 | 10/2000 |
| WO | 2004102226 A2 | 11/2004 |
| WO | 2008011066 A2 | 1/2008 |
| WO | 2008011066 A9 | 5/2008 |
| WO | 2008100545 A2 | 8/2008 |
| WO | 2008011066 A3 | 12/2008 |
| WO | 2009013597 A3 | 1/2009 |
| WO | 2007130130 A3 | 9/2009 |
| WO | 2010067117 A1 | 6/2010 |
| WO | 2010078856 A1 | 7/2010 |
| WO | 2010125337 A3 | 11/2010 |
| WO | 2011012825 A1 | 2/2011 |
| WO | 2011042711 A3 | 4/2011 |
| WO | 2013033274 A1 | 3/2013 |
| WO | 2013163347 A1 | 10/2013 |
| WO | 2013190257 A1 | 12/2013 |
| WO | 2016042283 A1 | 3/2016 |
| WO | 2016048729 A1 | 3/2016 |
| WO | 2016116733 A1 | 7/2016 |
| WO | 2016130509 A1 | 8/2016 |
| WO | 2016135434 A1 | 9/2016 |
| WO | 2016181108 A1 | 11/2016 |
| WO | 2016046514 A8 | 4/2017 |
| WO | 2017094129 A1 | 6/2017 |
| WO | 2017162999 A8 | 9/2017 |
| WO | 2017178781 A1 | 10/2017 |
| WO | 2017182771 A1 | 10/2017 |
| WO | 2017203200 A1 | 11/2017 |
| WO | 2017203201 A1 | 11/2017 |
| WO | 2017207987 A1 | 12/2017 |
| WO | 2018102834 A2 | 6/2018 |
| WO | 2018102834 A3 | 6/2018 |
| WO | 2018096359 A3 | 7/2018 |
| WO | 2018129398 A1 | 7/2018 |
| WO | 2018150163 A1 | 8/2018 |
| WO | 2019046649 A1 | 3/2019 |
| WO | 2019077307 A1 | 4/2019 |
| WO | 2019079350 A2 | 4/2019 |
| WO | 2019046649 A8 | 5/2019 |
| WO | 2019122806 A1 | 6/2019 |
| WO | 2019135784 A1 | 7/2019 |
| WO | 2019135796 A1 | 7/2019 |
| WO | 2019135837 A1 | 7/2019 |
| WO | 2019136470 A1 | 7/2019 |
| WO | 2019136471 A1 | 7/2019 |
| WO | 2019136473 A1 | 7/2019 |
| WO | 2019171038 A1 | 9/2019 |
| WO | 2020212682 A1 | 10/2020 |
| WO | 2021032982 A1 | 2/2021 |
| WO | 2021032983 A1 | 2/2021 |
| WO | 2021044121 A1 | 3/2021 |

OTHER PUBLICATIONS

International Preliminary Report on Patentability for International Application PCT/GB2017/000055, dated Oct. 16, 2018, dated Oct. 25, 2018, 9 pgs.
International Preliminary Report on Patentability for International Application PCT/US2018/012691, Report dated Jul. 9, 2019, dated Jul. 18, 2019, 10 pgs.
International Preliminary Report on Patentability for International Application PCT/GB2017/000040, Report dated Sep. 25, 2018 , dated Oct. 4, 2018, 7 pgs.
International Preliminary Report on Patentability for PCT Application No. PCT/US2013/038070, dated Oct. 28, 2014, 6 pgs.
International Search Report and Written Opinion for International Application No. PCT/US2019/031163, Search completed Jul. 9, 2019, dated Jul. 29, 2019, 11 pgs.
International Search Report and Written Opinion for International Application No. PCT/GB2010/000835, completed Oct. 26, 2010, dated Nov. 8, 2010, 12 pgs.
International Search Report and Written Opinion for International Application No. PCT/GB2010/001920, completed Mar. 29, 2011, dated Apr. 6, 2011, 15 pgs.
International Search Report and Written Opinion for International Application No. PCT/GB2015/000228, Search completed May 4, 2011, dated Jul. 15, 2011, 15 pgs.
International Search Report and Written Opinion for International Application No. PCT/GB2016/000036, completed Jul. 4, 2016, dated Jul. 13, 2016, 10 pgs.
International Search Report and Written Opinion for International Application No. PCT/GB2017/000055, Search completed Jul. 19, 2017, dated Jul. 26, 2017, 12 pgs.
International Search Report and Written Opinion for International Application No. PCT/US2013/038070, completed Aug. 12, 2013, dated Aug. 14, 2013, 12 pgs.
International Search Report and Written Opinion for International Application No. PCT/US2018/012691, completed Mar. 10, 2018, dated Mar. 28, 2018, 16 pgs.
International Search Report and Written Opinion for International Application No. PCT/US2018/015553, completed Aug. 6, 2018, dated Sep. 19, 2018, 12 pgs.
International Search Report and Written Opinion for International Application No. PCT/US2018/037410, Search completed Aug. 16, 2018, dated Aug. 30, 2018, 11 pgs.
International Search Report and Written Opinion for International Application No. PCT/US2018/048636, Search completed Nov. 1, 2018, dated Nov. 15, 2018, 16 pgs.
International Search Report and Written Opinion for International Application No. PCT/US2018/056150, Search completed Dec. 4, 2018, dated Dec. 26, 2018, 10 pgs.
International Search Report and Written Opinion for International Application No. PCT/US2018/062835, Search completed Jan. 14, 2019, dated Jan. 31, 2019, 14 pgs.
International Search Report and Written Opinion for International Application No. PCT/US2019/012758, completed Mar. 12, 2019, dated Mar. 27, 2019, 9 pgs.
International Search Report and Written Opinion for International Application No. PCT/US2019/012764, completed Mar. 1, 2019, dated Mar. 18, 2019, 9 pgs.
International Search Report and Written Opinion for International Application No. PCT/US2018/048960, Search completed Dec. 14, 2018, dated Jan. 8, 2019, 14 pgs.
International Search Report and Written Opinion for International Application PCT/GB2016/000181, completed Dec. 21, 2016, dated Feb. 27, 2017, 21 pgs.
International Search Report and Written Opinion for International Application PCT/US2019/012759, completed Mar. 14, 2019, dated Apr. 15, 2019, 12 pgs.
International Search Report for PCT/GB2013/000273, completed by the European Patent Office dated Aug. 30, 2013, 4 pgs.
International Search Report for PCT/GB2016/000051, Completed Aug. 11, 2016, 3 pgs.
Written Opinion for International Application No. PCT/GB2010/001982, search completed Feb. 24, 2011, dated Mar. 8, 2011, 6 pgs.
Written Opinion for International Application No. PCT/GB2013/000273, completed Aug. 30, 2013, dated Sep. 9, 2013, 7 pgs.
Written Opinion for International Application No. PCT/GB2015/000203, completed Oct. 29, 2015, dated Nov. 16, 2015, 7 pgs.
Written Opinion for International Application No. PCT/GB2016/000051, Search completed Aug. 11, 2016 , dated Aug. 22, 2016, 6 pgs.

(56) References Cited

OTHER PUBLICATIONS

Written Opinion for International Application PCT/GB2016/000003, completed May 31, 2016, dated Aug. 12, 2016, 10 pgs.
"Navy awards SGB Labs a contract for HMDs for simulation and training", Press releases, DigiLens, Oct. 2012, pp. 1-2.
"Plastic has replaced glass in photochromic lens", 2003, 1 page.
"USAF Awards SGB Labs an SBIR Contract for Wide Field of View HUD", Press Release ,SBG Labs DigiLens, Apr. 2014, 2 pgs.
"Webster's Third New International Dictionary 433", (1986), 3 pgs.
Amitai et al., "Visor-display design based on planar holographic optics", Applied Optics, vol. 34, No. 8, Mar. 10, 1995, pp. 1352-1356.
Cameron, "The Application of Holographic Optical Waveguide Technology to Q-Sight™ Family of Helmet Mounted Displays", Proc. of SPIE, 2009, 11 pgs, vol. 7326.
Crawford, "Electrically Switchable Bragg Gratings", Optics & Photonics News, pp. 54-59, Apr. 2003.
Dabrowski, "High Birefringence Liquid Crystals", Crystals, Sep. 3, 2013, vol. 3, No. 3, pp. 443-482.
Irie, "Photochromic diarylethenes for photonic devices", Pure and Applied Chemistry, 1996, pp. 1367-1371, vol. 68, No. 7, IUPAC.
Levola et al., "Replicated slanted gratings with a high refractive index material for in and outcoupling of light", Optics Express, vol. 15, Issue 5, pp. 2067-2074 (2007).
Moffitt, "Head-Mounted Display Image Configurations", retrieved from the internet on Dec. 19, 2014, dated May 2008, 25 pgs.
Natarajan et al., "Electro Optical Switching Characteristics of Volume Holograms in Polymer Dispersed Liquid Crystals", Journal of Nonlinear Optical Physics and Materials, 1997, vol. 5, No. 1, pp. 666-668.
Nordin G et al., "Diffraction Properties of Stratified Volume Holographic Optical Elements", Journal of the Optical Society of America A., vol. 9, No. 12, Dec. 1992, pp. 2206-2217.
Sagan et al., "Electrically Switchable Bragg Grating Technology for Projection Displays", Proc. SPIE. vol. 4294, Jan. 24, 2001, pp. 75-83.
Schechter et al., "Compact beam expander with linear gratings", Applied Optics, vol. 41, No. 7, Mar. 1, 2002, pp. 1236-1240.
Sun et al., "Effects of multiwalled carbon nanotube on holographic polymer dispersed liquid crystal", Polymers Advanced Technologies, Feb. 19, 2010, DOI: 10.1002/pat.1708, 8 pgs.
Urey, "Diffractive exit pupil expander for display applications", Applied Optics, vol. 40, Issue 32, pp. 5840-5851 (2001).
Wisely, "Head up and head mounted display performance improvements through advanced techniques in the manipulation of light", Proc. of SPIE, 2009, 10 pgs, vol. 7327.
Extended European Search Report for European Application No. 18727645.6, Search completed Oct. 14, 2020, dated Oct. 23, 2020, 13 Pgs.
Supplementary Partial European Search Report for European Application No. 18727645.6, Search completed Jul. 2, 2020, dated Jul. 13, 2020, 13 Pgs.
Extended European Search Report for EP Application No. 13192383, dated Apr. 2, 2014, 7 pgs.
Extended European Search Report for European Application No. 13765610.4 dated Feb. 16, 2016, 6 pgs.
Extended European Search Report for European Application No. 15187491.4, search completed Jan. 15, 2016, dated Jan. 28, 2016, 5 pgs.
International Preliminary Report on Patentability for International Application No. PCT/GB2010/000835, dated Nov. 1, 2011, dated Nov. 10, 2011, 9 pgs.
International Preliminary Report on Patentability for International Application No. PCT/GB2010/001920, dated Apr. 11, 2012, dated Apr. 19, 2012, 10 pgs.
International Preliminary Report on Patentability for International Application No. PCT/GB2010/001982, report dated May 1, 2012, dated May 10, 2012, 7 pgs.
International Preliminary Report on Patentability for International Application No. PCT/GB2013/000273, dated Dec. 23, 2014, dated Dec. 31, 2014, 8 pgs.
International Preliminary Report on Patentability for International Application No. PCT/GB2015/000203, dated Mar. 21, 2017, dated Mar. 30, 2017, 8 pgs.
International Preliminary Report on Patentability for International Application No. PCT/GB2016/000036, dated Aug. 29, 2017, dated Sep. 8, 2017, 8 pgs.
International Preliminary Report on Patentability for International Application No. PCT/GB2016/000051, Report dated Sep. 19, 2017, dated Sep. 28, 2017, 7 pgs.
International Preliminary Report on Patentability for International Application PCT /US2018/015553, Report dated Jun. 4, 2019, dated Jun. 13, 2019, 6 pgs.

* cited by examiner

| Sub System | Layer | Symbol in FIG.1 | Refractive Index at 785 nm. | Layer Thickness (Microns) |
|---|---|---|---|---|
| | SBG Lower Substrate | 21 | 1.4987 | 1100 |
| First SBG Array | First SBG Array | 20 | 1.5400 | 4 |
| | SBG upper cell glass | 22 | 1.4987 | 500 |
| | Air gap above SBG | 23 | 1.0000 | 5 |
| Transmission Grating | Transmission Grating | 43 | 1.4856 | 50 |
| | Low index glass (Clad Glue) | 42 | 1.4100 | 5 |
| Second SBG Array | SBG Substrate | 41 | 1.4987 | 300 |
| | Second SBG Array | 4 | 1.5400 | 4 |
| | Barrier Film | 40C | 1.5000 | 5 |
| Detector Waveguide | waveguide core | 50 | 1.5100 | 22 |
| | Bottom buffer (clad) | 51 | 1.4060 | 16 |
| | Priming layer | 61 | 1.5000 | 5 |
| Platen | Platen | 6 | 1.4987 | 400 |

FIG.18

CONTACT IMAGE SENSOR USING SWITCHABLE BRAGG GRATINGS

CROSS-REFERENCE TO RELATED APPLICATION

This application is a continuation of U.S. application Ser. No. 16/281,969 filed Feb. 21, 2019, which is a continuation of U.S. application Ser. No. 15/799,590 filed Oct. 31, 2017, which is a continuation of U.S. application Ser. No. 14/370, 887 filed Jul. 7, 2014, which is a U.S. National Phase of PCT Application No. PCT/GB2013/000005 filed Jan. 7, 2013, which claims the benefit of U.S. Provisional Patent Application No. 61/629,587 filed Jan. 6, 2012, the disclosures of which are incorporated herein by reference in their entireties.

BACKGROUND OF THE INVENTION

The present invention relates to an imaging sensor, and more particularly to a contact image sensor using electrically switchable Bragg gratings. This application incorporates by reference in its entirety PCT Application Number: PCT/GB2011/000349 with International Filing Date: Nov. 3, 2011 entitled BIOMETRIC SENSOR by the present inventors.

A contact image sensor is an integrated module that comprises an illumination system, an optical imaging system and a light-sensing system—all within a single compact component. The object to be imaged is place in contact with a transparent outer surface (or platen) of the sensor. Well known applications of contact image sensors include document scanners, bar code readers and optical identification technology. Another field of application is in biometric sensors, where there is growing interest in automatic finger print detection. Fingerprints are a unique marker for a person, even an identical twin, allowing trained personal or software to detect differences between individuals. Fingerprinting using the traditional method of inking a finger and applying the inked finger to paper can be extremely time-consuming. Digital technology has advanced the art of fingerprinting by allowing images to be scanned and the image digitized and recorded in a manner that can be searched by computer. Problems can arise due to the quality of inked images. For example, applying too much or too little ink may result in blurred or vague images. Further, the process of scanning an inked image can be time-consuming. A better approach is to use "live scanning" in which the fingerprint is scanned directly from the subject's finger. More specifically, live scans are those procedures which capture fingerprint ridge detail in a manner which allows for the immediate processing of the fingerprint image with a computer. Examples of such fingerprinting systems are disclosed in Fishbine et al. (U.S. Pat. Nos. 4,811,414 and 4,933,976); Becker (U.S. Pat. No. 3,482,498); McMahon (U.S. Pat. No. 3,975,711); and Schiller (U.S. Pat. Nos. 4,544,267 and 4,322,163). A live scanner must be able to capture an image at a resolution of 500 dots per inch (dpi) or greater and have generally uniform gray shading across a platen scanning area. There is relevant prior art in the field of optical data processing in which optical waveguides and electro-optical switches are used to provide scanned illumination One prior art waveguide illuminator is disclosed in U.S. Pat. No. 4,765,703. This device is an electro-optic beam deflector for deflecting a light beam within a predetermined range of angle. It includes an array of channel waveguides and plural pairs of surface electrodes formed on the surface of a planar substrate of an electro-optic material such as single crystal $LiNbO_3$.

While the fingerprinting systems disclosed in the foregoing patents are capable of providing optical or optical and mechanical fingerprint images, such systems are only suitable for use at a central location such as a police station. Such a system is clearly not ideal for law enforcement and security applications where there is the need to perform an immediate identity and background check on an individual while in the field. In general current contact image sensor technology tends to be bulky, low in resolution and unsuitable for operation in the field.

Thus there exists a need for a portable, high resolution, lightweight optical contact sensor for generating images in the field.

SUMMARY OF THE INVENTION

It is an object of the present invention to provide a portable, high resolution, lightweight contact image sensor for generating images in the field.

A contact image sensor according to the principles of the invention comprises the following parallel optical layers configured as a stack: an illumination means for providing a collimated beam of first polarization light; a first SBG array device further comprising first and second transparent substrates sandwiching an array of selectively switchable SBG column elements, and ITO electrodes applied to opposing faces of the substrates and the SBG substrates together providing a first TIR light guide for transmitting light in a first TIR beam direction; an air gap; a transmission grating; a third transparent substrate (low index glue layer); a SBG cover glass; a ITO layer; a second SBG array device comprising an array of selectively switchable SBG column elements; a ITO layer; a barrier film; a waveguiding layer comprising a multiplicity of waveguide cores separated by cladding material having a generally lower refractive index than the cores, the cores being disposed parallel to the first beam direction; an upper clad layer having a generally lower refractive index than the cores (which is also referred to as the bottom buffer); a priming layer; and a platen. The apparatus further comprises: means for coupling light from the illumination means into the first TIR light guide; means for coupling light out of the core into an output optical path; and a detector comprising at least one photosensitive element, the photosensitive element being optically coupled to at least one the core. ITO electrodes are applied to the opposing faces of the third transparent substrate and the waveguiding layer. The column elements of the first and second SBG arrays have longer dimensions disposed orthogonally to the first TIR beam direction.

In one embodiment of the invention the air gap may be replace by a refracting material layer.

Each SBG element in the first and second SBG arrays has a diffracting state when no electric field is present across the ITO electrodes and a non-diffracting state when an electric field is present across the ITO electrodes, the SBG elements diffracting only the first polarization light.

The elements of the second SBG device which are in a non-diffracting state have a generally lower refractive index than the cores. The third transparent substrate has a generally lower refractive index than the cores. At any time one element of the first SBG array is in a diffracting state, one element of the second SBG array is in a diffracting state, and all other elements of the first and second are in a non-diffracting state.

In one embodiment of the invention an active SBG element of the first SBG array in a diffracting state diffracts incident first TIR light upwards into a first beam direction. The transmission grating diffracts the first beam direction light upwards into a second beam direction. When contact is made with an external material at a point on the platen a portion of the second beam direction light incident at the point on the platen contacted by said external material is transmitted out of the platen. All other light incident on the outer surface of the platen is reflected downwards in a third optical path, the third optical path traversing the cores. An active SBG element of the second SBG array along the third beam direction diffracts the third angle light downwards into a fourth beam direction. The fourth beam direction light is reflected upwards at the third transparent substrate into a fifth beam direction. The fifth beam direction light exceeds the critical angle set by the core/clad interface and the critical angle set by one of the core/second SBG array or second SBG array/third transparent substrate interfaces, providing a TIR path to the detector.

The first to fifth beam directions lie in a plane orthogonal to the first SBG array.

In one embodiment of the invention the third transparent substrate has a generally lower refractive index than the element of the second SBG array in its diffracting state.

In one embodiment of the invention the third transparent substrate has a generally lower refractive index than the element of the second SBG array in its non-diffracting state.

In one embodiment of the invention the apparatus further comprises a transparent slab of index lower than the third substrate disposed between the third substrate and the transmission grating.

In one embodiment of the invention the output from detector array element is read out in synchronism with the switching of the elements of the first SBG array.

In one embodiment of the invention the apparatus further comprises a transparent slab of index lower than the third substrate disposed between the third substrate and the transmission grating. An active SBG element of the first SBG array in a diffracting state diffracts incident first TIR light upwards into a first optical path in a plane orthogonal to the first SBG array. The transmission grating diffracts the first optical path light upwards into a second optical path. When contact is made with an external material at a point on the platen a portion of the second beam direction light incident at the point on the platen contacted by said external material is transmitted out of the platen. All other light incident on the outer surface of the platen is reflected downwards in a third optical path, the third optical path traversing the cores. The third optical path traverses the core. An active SBG element of the second SBG array along the third optical path diffracts the third angle light downwards into a fourth optical path. The fourth optical path light is reflected upwards at least one of the third transparent substrate or the slab into a fifth optical path. The fifth optical path light exceeds the critical angle set by the core/clad interface and the critical angle set by one of the core/second SBG array, second SBG array/third substrate or third substrate/slab interfaces, providing a TIR path to the detector. The first to fifth optical paths lie in a plane orthogonal to the first SBG array.

In one embodiment of the invention the illumination means comprises a laser, a collimator lens.

In one embodiment of the invention the means for coupling light from the illumination means into the first TIR light guide is a grating.

In one embodiment of the invention the means for coupling light from the illumination means into the first TIR light guide is a prismatic element.

In one embodiment of the invention the means for coupling the second TIR light into the waveguide is a grating.

In one embodiment of the invention the means for coupling light out of the waveguide is a grating.

In one embodiment of the invention the first and second SBG arrays each comprise continuous SBG layers and the selectively switchable elements of first and second SBG arrays are defined by configuring at least one of the transparent electrodes as a multiplicity of selectively switchable electrode elements.

In one embodiment of the invention an air gap is provided between the first SBG array and the transmission grating.

In one embodiment of the invention the sensor further comprises a priming layer between the upper clad layer and the platen.

In one embodiment of the invention at least one of the transparent electrodes and substrates sandwiches a barrier layer.

In one embodiment of the invention the transparent substrates are fabricated from plastic.

In one embodiment of the invention the transparent substrates are fabricated from a polycarbonate In one embodiment of the invention the waveguide cores are fabricated from an electrically conductive material.

In one embodiment of the invention the waveguide cores are fabricated from PDOT

In one embodiment of the invention the waveguide cores are fabricated from CNT.

In one embodiment of the invention the waveguides are fabricated from CNT using a lift-off stamping process.

In one embodiment of the invention the waveguides are coupled to linear array of detectors.

In one embodiment of the invention the waveguides are coupled to a two dimensional detector array.

In one embodiment of the invention the transparent electrodes are fabricated from ITO.

In one embodiment of the invention the transparent electrodes are fabricated from CNT.

In one embodiment of the invention the transparent electrodes are fabricated from PDOT.

In one embodiment of the invention the waveguides are fabricated from PDOT.

In one embodiment of the invention the waveguide cores are fabricated from a conductive photopolymer the waveguide cores being and second SBG array elements being disposed such that only the portions off the SBG array elements lying directly under the waveguide cores are switched.

In one embodiment of the invention the SBG arrays are fabricated using a reverse mode HPDLC.

In one embodiment of the invention there is provided a method of making a contact image measurement comprising the steps of:

a) providing an apparatus comprising the following parallel optical layers configured as a stack: an illumination means for providing a collimated beam of first polarization light; a first SBG array device further comprising first and second transparent substrates sandwiching an array of selectively switchable SBG column elements, and ITO electrodes applied to opposing faces of the substrates and the SBG substrates together providing a first TIR light guide for transmitting light in a first beam direction; an air gap; a transmission grating; a transparent substrate (low index glue); an SBG cover glass; a ITO layer; a second SBG array device comprising array of selectively switchable SBG column elements; a ITO layer; a barrier film; a waveguiding layer comprising a multiplicity of waveguide cores separated by cladding material having a generally lower refractive index than the cores, the cores being disposed parallel to the first beam direction; an upper clad layer having a generally lower refractive index than the cores (which is also referred to as the bottom buffer); a priming layer; a platen; and further comprising: means for coupling light from the illumination means into the first TIR light guide; means for coupling light out of the waveguide into an output optical path; and a detector comprising at least one photosensitive element, wherein ITO electrodes are applied to the opposing faces of the substrate and the waveguide core;

b) an external material contacting a point on the external surface of the platen;

c) sequentially switching elements of the first SBG array into a diffracting state, all other elements being in their non-diffracting states;

d) sequentially switching elements of the second SBG array into a diffracting state, all other elements being in their non-diffracting states;

e) each diffracting SBG element of the first SBG array diffracting incident first TIR light upwards into a first optical path, f) the transmission grating diffracting the first optical path light upwards into a second optical path, g) a portion of the second optical path light incident at the point on the platen contacted by said external material being transmitted out of the platen and any other light being reflected downwards in a third optical path, the third optical path traversing one the core, h) an active SBG element of the second SBG array along the third optical path diffracting the third angle light downwards into a fourth optical path, i) the fourth optical path light being reflected upwards into a fifth optical path at the third substrate, the fifth optical path light exceeding the critical angle set by the core/clad interface and the critical angle set by one of the core/second SBG array or second SBG array/third substrate interfaces, and proceeding along a TIR path to the detector.

The first to fifth optical paths lie in a plane orthogonal to the first SBG array.

In one embodiment of the invention the method further comprises a transparent slab of index lower than the substrate disposed between the substrate and the transmission grating, such that the fourth optical path light is reflected upwards at the substrate into a fifth optical path and the fifth optical path light exceeds the critical angle set by the core/clad interface and the critical angle set by one of the core/second SBG array, second SBG array/third substrate or third substrate/slab interfaces, providing a TIR path to the detector.

In one embodiment of the invention the air gap may be replaced by a refracting material layer.

In one embodiment of the invention the illumination means comprises a multiplicity of laser illumination channels, each said channel comprising a laser and collimating lens system. The illumination means provides a multiplicity of collimated, abutting beams of rectangular cross section.

In one embodiment of the invention the illumination means comprises a laser and a collimator lens. The said illumination means provides a collimated beam of rectangular cross section.

In one embodiment of the invention the optical wave guiding structure comprises a multiplicity of parallel strip cores separated by cladding material.

In one embodiment of the invention the optical wave guiding structure comprises a single layer core.

In one embodiment of the invention the SBG elements are strips aligned normal to the propagation direction of the TIR light.

In one embodiment of the invention the SBG elements are switched sequentially across the SBG array and only one SBG element is in its diffracting state at any time.

In one embodiment of the invention the sensor further comprises a microlens array disposed between the SBG device and the first cladding layer.

In one embodiment of the invention the means for coupling light from the illumination means into the first TIR light guide is a grating.

The illumination device of claim the means for coupling light from the illumination means into the first TIR light guide is a prismatic element.

In one embodiment of the invention the means for coupling the second TIR light into the wave-guiding structure is a grating.

In one embodiment of the invention the means for coupling light out of the wave-guiding structure is a grating.

In one embodiment of the invention, the output light from the wave guiding device is coupled into a linear detector array.

In one embodiment of the invention, the output light from the wave guiding device is coupled into a two dimensional detector array.

In one embodiment of the invention a contact image sensor further comprises a half wave retarder array 3 disposed between the air gap and the transmission grating. The half wave retarder array comprises an array of column-shaped elements sandwiched by transparent substrates. Each retarder element in the half wave retarder array is switchable between a polarization rotating state in which it rotates the polarization of incident light through ninety degrees and a non-polarization rotating state. The column elements of the half wave retarder array have longer dimensions disposed parallel the first TIR beam direction. Each half wave retarder array element overlaps at least one strip element of the first SBG array. At any time one element of the first SBG array is in a diffracting state and is overlapped by an element of the half wave retarder array in its non-polarization rotating state, one element of the second SBG array is in a diffracting state, all other elements of the first and second SBG arrays are in a non-diffracting state and all other elements of the half wave retarder array are in their polarization rotating states.

One embodiment of the invention uses a SBG waveguiding structure. In this embodiment there is provided a contact image sensor comprising the following parallel optical layers configured as a stack: an illumination means for providing a collimated beam of first polarization light; a first SBG array device further comprising first and second transparent substrates sandwiching an array of selectively switchable SBG column, and transparent electrodes applied to opposing faces of said substrate, the SBG substrates together providing a first TIR light guide for transmitting light in a first TIR beam direction; a transmission grating; a second SBG array device further comprising third and fourth transparent substrates sandwiching a multiplicity of high index HPDLC regions separated by low index HPDLC regions and patterned transparent electrodes applied to opposing faces of the substrates; and a platen. The apparatus and further comprises: means for coupling light from the illumination means into the first TIR light guide; means for coupling light out of the second SBG array device into an output optical path; and a detector comprising at least one photosensitive element. The high index regions provide waveguiding cores disposed parallel to the first beam direction. The low index HPDLC regions provide waveguide cladding. The third and fourth substrate layers have a generally lower refractive index than the cores. The patterned electrodes applied to the third substrate comprise column shaped elements defining a multiplicity of selectively switchable columns of SBG elements which are aligned orthogonally to the waveguiding cores. The patterned electrodes applied to the fourth substrate comprise elongate elements overlapping the low index HPDLC regions. The detector comprises an array of photosensitive elements, each photosensitive element being optically coupled to at least one waveguiding core. Each SBG element in the first and second SBG arrays is switchable between a diffracting state and a non-diffracting state with the SBG elements diffracting only first polarization light.

In one embodiment of the invention based on an SBG waveguiding structure the diffracting state exists when an electric field is applied across the SBG element and a non-diffracting state exists when no electric field is applied.

In one embodiment of the invention based on an SBG waveguiding structure the said diffracting state exists when no electric field is applied across the SBG element and said non diffracting states exists when an electric field is applied.

In one embodiment based on an SBG waveguiding structure of the invention at any time one element of the first SBG array is in a diffracting state, one element of the second SBG array is in a diffracting state, all other elements of the first and second are in a non-diffracting state.

In one embodiment of the invention based on an SBG waveguiding structure an active SBG element of the first SBG array in a diffracting state diffracts incident first TIR light upwards into a first beam direction. The transmission grating diffracts the first beam direction light upwards into a second beam direction. When contact is made with an external material at a point on the platen a portion of the second beam direction light incident at the point on the platen contacted by the external material is transmitted out of the platen. Light incident on the outer surface of the platen in the absence of external material is reflected downwards in a third optical path. The third optical path traverses the cores. An active column of the second SBG array along the third beam direction diffracts the third angle light into a second TIR path down the traversed core towards the detector. The first to third optical paths and the first and second TIR paths are in a common plane.

In one embodiment of the invention based on an SBG waveguiding structure the output from detector array element is read out in synchronism with the switching of the elements of the first SBG array.

In one embodiment of the invention based on an SBG waveguiding structure there is provided an air gap between the first SBG array and the transmission grating.

In one embodiment of the invention based on an SBG waveguiding structure there is provided a method of making a contact image measurement comprising the steps of:

a) providing an apparatus comprising the following parallel optical layers configured as a stack: an illumination means for providing a collimated beam of first polarization light; a first SBG array device further comprising first and second transparent substrates sandwiching an array of selectively switchable SBG column elements, and transparent electrodes applied to opposing faces of the substrates and the SBG substrates together providing a first TIR light guide for transmitting light in a first beam direction; a transmission grating; a transparent substrate; a second SBG array device further comprising third and fourth substrates sandwiching a multiplicity of high index HPDLC regions separated by low index HPDLC regions and patterned transparent electrodes applied to opposing faces of the substrates; a platen; and a detector; and further comprising: means for coupling light from the illumination means into the first TIR light guide; means for coupling light out of the second SBG array device into an output optical path; and a detector comprising at least one photosensitive element; the high index regions providing waveguiding cores disposed parallel to the first beam direction and the low index HPDLC regions providing waveguide cladding; the substrates layers having a generally lower refractive index than the cores, the patterned electrodes applied to the third substrate defining a multiplicity of selectively switchable columns orthogonal to the waveguiding cores and the patterned electrodes applied to the fourth substrate overlapping the low index HPDLC regions b) an external material contacting a point on the external surface of the platen;

c) sequentially switching elements of the first SBG array into a diffracting state, all other elements being in their non-diffracting states;

d) sequentially switching columns of the second SBG array device into a diffracting state, all other columns being in their non-diffracting states;

e) each diffracting SBG element of the first SBG array diffracting incident first TIR light upwards into a first optical path, f) the transmission grating diffracting the first optical path light upwards into a second optical path, g) a portion of the second optical path light incident at the point on the platen contacted by the external material being transmitted out of the platen, while portions of said second optical path light not incident at the point are reflected downwards in a third optical path, the third optical path traversing one core, h) an active SBG column element of the second SBG array along the third optical path diffracting the third angle light in a second TIR path down the traversed core and proceeding along a TIR path along the core to the detector.

In one embodiment of the invention there is provided a contact image sensor using a single SBG array layer comprising: an illumination means for providing a collimated beam of first polarization light; an SBG array device further comprising first and second transparent substrates sandwiching an array of selectively switchable SBG columns, and transparent electrodes applied to opposing faces of the substrates, said SBG substrates together providing a first TIR light guide for transmitting light in a first TIR beam direction; a first transmission grating layer overlaying the lower substrate of the SBG array device; a second transmission grating layer overlaying the upper substrates of the SBG array device; a quarter wavelength retarder layer overlaying the second transmission grating layer; a platen overlaying thy quarter wavelength retarder layer; and a polarization rotating reflecting layer overlaying the first transmission grating layer. The apparatus further comprises: means for coupling light from said illumination means into said SBG array device; means for coupling light out of the second SBG array device into an output optical path; and a detector comprising at least one photosensitive element.

A more complete understanding of the invention can be obtained by considering the following detailed description in conjunction with the accompanying drawings wherein like index numerals indicate like parts. For purposes of clarity, details relating to technical material that is known in the technical fields related to the invention have not been described in detail.

BRIEF DESCRIPTION OF THE DRAWINGS

FIG. 18 is a table showing typical refractive indices and layer thicknesses used in the first embodiment of the invention.

DETAILED DESCRIPTION OF THE INVENTION

Figure 1:
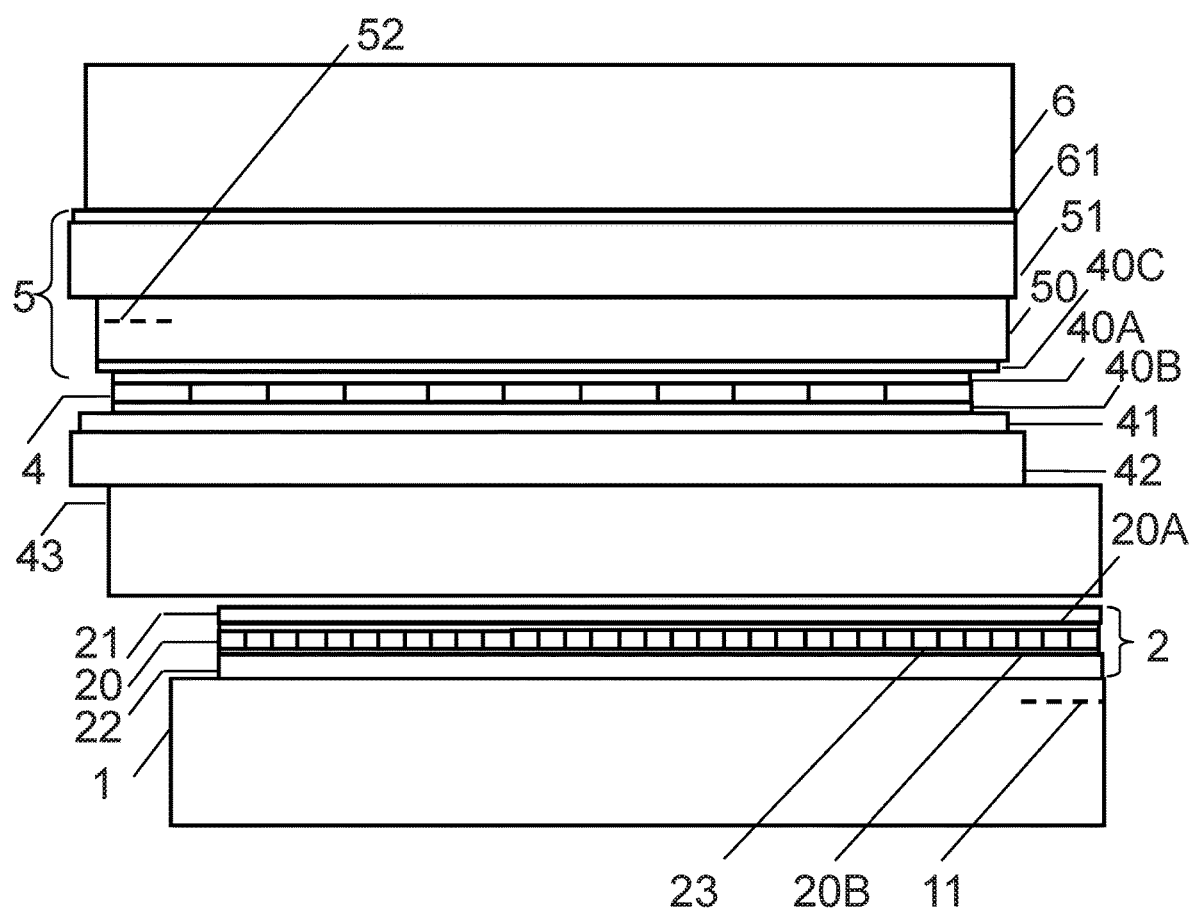
FIG. 1 is a schematic side elevation view of a contact image sensor in a first embodiment of the invention.

It will be apparent to those skilled in the art that the present invention may be practiced with some or all of the present invention as disclosed in the following description. For the purposes of explaining the invention well-known features of optical technology known to those skilled in the art of optical design and visual displays have been omitted or simplified in order not to obscure the basic principles of the invention.

Unless otherwise stated the term "on-axis" in relation to a ray or a beam direction refers to propagation parallel to an axis normal to the surfaces of the optical components described in relation to the invention. In the following description the terms light, ray, beam and direction may be used interchangeably and in association with each other to indicate the direction of propagation of light energy along rectilinear trajectories.

Parts of the following description will be presented using terminology commonly employed by those skilled in the art of optical design.

It should also be noted that in the following description of the invention repeated usage of the phrase "in one embodiment" does not necessarily refer to the same embodiment.

In the following description the term "grating" will refer to a Bragg grating. The term "switchable grating" will refer to a Bragg grating that can be electrically switched between an active or diffracting state and an inactive or non-diffractive state. In the embodiments to be described below the preferred switchable grating will be a Switchable Bragg Grating (SBG) recording in a Holographic Polymer Dispersed Liquid Crystal (HPDLC) material. The principles of SBGs will be described in more detail below. For the purposes of the invention a non switchable grating may be based on any material or process currently used for fabricating Bragg gratings. For example the grating may be recorded in a holographic photopolymer material.

An SBG comprises a HPDLC grating layer sandwiched between a pair of transparent substrates to which transparent electrode coatings have been applied. The first and second beam deflectors essentially comprise planar fringe Bragg gratings. Each beam deflector diffracts incident planar light waves through an angle determined by the Bragg equation to provide planar diffracted light waves.

An (SBG) is formed by recording a volume phase grating, or hologram, in a polymer dispersed liquid crystal (PDLC) mixture. Typically, SBG devices are fabricated by first placing a thin film of a mixture of photopolymerizable monomers and liquid crystal material between parallel glass plates. Techniques for making and filling glass cells are well known in the liquid crystal display industry. One or both glass plates support electrodes, typically transparent indium tin oxide films, for applying an electric field across the PDLC layer. A volume phase grating is then recorded by illuminating the liquid material with two mutually coherent laser beams, which interfere to form the desired grating structure. During the recording process, the monomers polymerize and the HPDLC mixture undergoes a phase separation, creating regions densely populated by liquid crystal micro-droplets, interspersed with regions of clear polymer. The alternating liquid crystal-rich and liquid crystal-depleted regions form the fringe planes of the grating. The resulting volume phase grating can exhibit very high diffraction efficiency, which may be controlled by the magnitude of the electric field applied across the PDLC layer. When an electric field is applied to the hologram via transparent electrodes, the natural orientation of the LC droplets is changed causing the refractive index modulation of the fringes to reduce and the hologram diffraction efficiency to drop to very low levels resulting in for a "non-diffracting" state. Note that the diffraction efficiency of the device can be adjusted, by means of the applied voltage, over a continuous range from near 100% efficiency with no voltage applied to essentially zero efficiency with a sufficiently high voltage applied. U.S. Pat. Nos. 5,942,157 and 5,751,452 describe monomer and liquid crystal material combinations suitable for fabricating SBG devices.

To simplify the description of the invention the electrodes and the circuits and drive electronics required to perform switching of the SBG elements are not illustrated in the Figures. Methods for fabricated patterned electrodes suitable for use in the present invention are disclosed in PCT US2006/043938. Other methods for fabricating electrodes and schemes for switching SBG devices are to be found in the literature. The present invention does not rely on any particular method for fabricating transparent switching electrodes or any particular scheme for switching arrays of SBGs.

To clarify certain geometrical of aspects of the invention reference will be made to the orthogonal XYZ coordinate system where appropriate.

Figure 2:
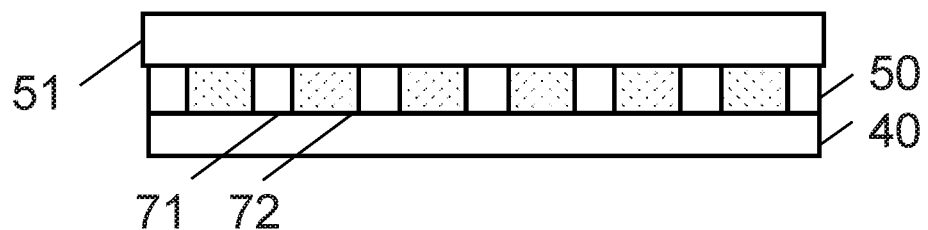
FIG. 2 is a schematic front elevation of the waveguiding structure used in the first embodiment of the invention showing the cross sections of the waveguide cores and cladding.
Figure 19:
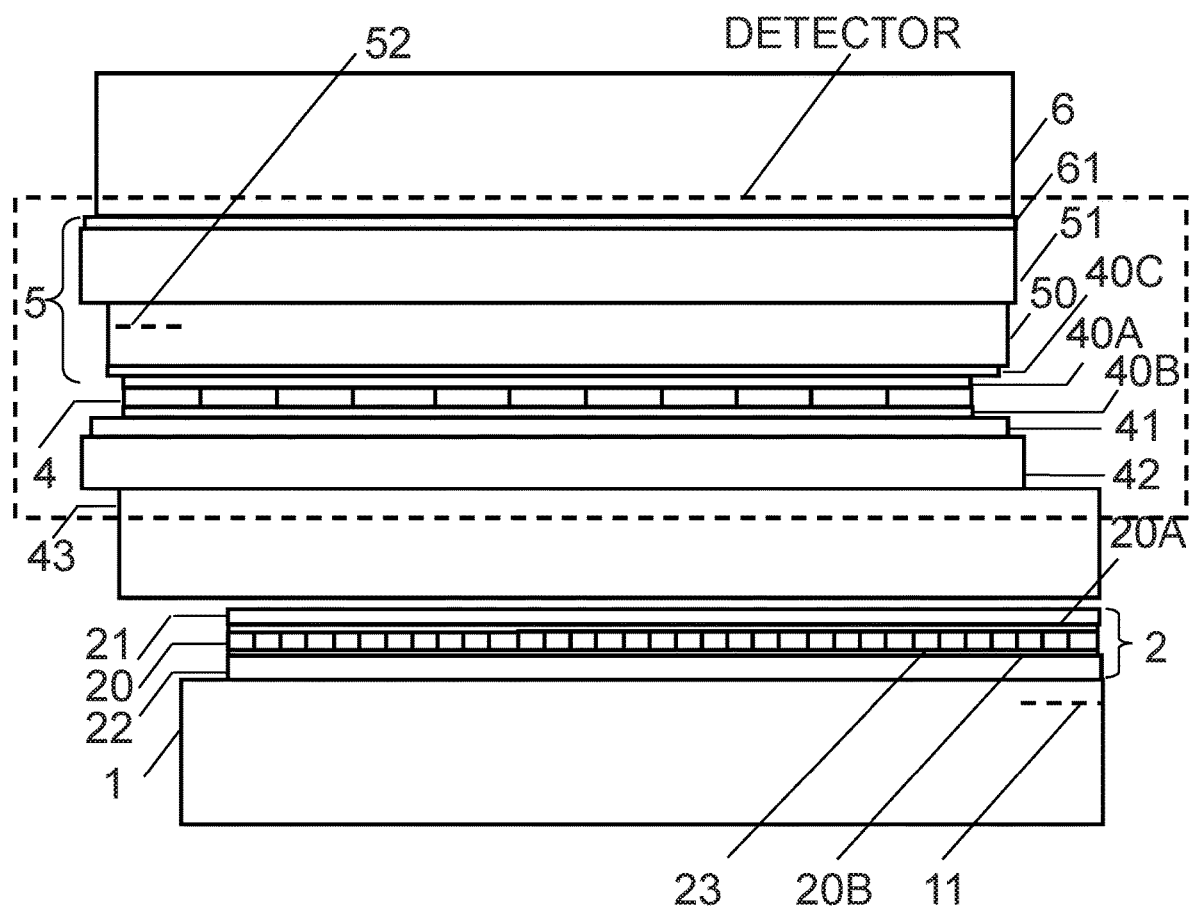
FIG. 19 is a schematic cross sectional view of a contact image sensor in one embodiment.
Figure 20:
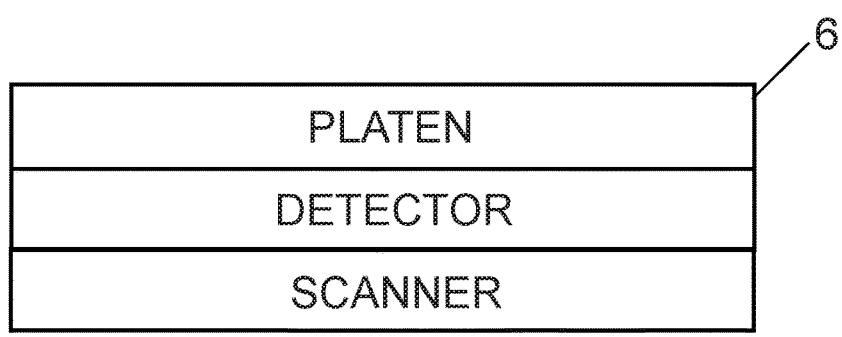
FIG. 20 is a block diagram illustrating the function components of a contact image sensor in one embodiment.

A contact image sensor according to the principles of the invention is illustrated in the schematic side elevation view of FIGS. 1 and 19. The apparatus comprises the following parallel optical layers configured as a stack: an illumination means 1 for providing a collimated beam of first polarized light; a first SBG array device 2 further comprising first and second transparent substrates 21,22 sandwiching an array 20 of selectively switchable SBG column elements, and ITO electrodes 20A,20B applied to opposing faces of the substrates, the SBG substrates together providing a first TIR light guide for transmitting light in a first TIR beam direction; an air gap 23; a transmission grating 43; a third transparent substrate (low index glue layer 42; a low refractive index SBG cover glass 41; a ITO layer 40B; a second SBG array device 4 comprising an array of selectively switchable SBG column elements; a ITO layer 40B; a barrier film 40C; a waveguiding layer 50 comprising a multiplicity of waveguide cores separated by cladding material having a generally lower refractive index than the cores, the cores being disposed parallel to the first beam direction; an upper clad layer 51 having a generally lower refractive index than the cores (which is also referred to as the bottom buffer); a priming layer 61; and a platen 6, as shown in FIG. 20. Each core of the waveguide structure is optically couple to an element of a detector array. The details of the waveguide to detector coupling will be discussed later. The apparatus further comprises: means for coupling light from the illumination means into the first TIR light guide; means for coupling light out of the core into an output optical path; and a detector comprising at least one photosensitive element, the photosensitive element being optically coupled to at least one the core. The illumination means may further comprise optical stops to eliminate stray light and scatter. The first polarized light may be either S or P polarized. Since SBGs recorded in the inventors preferred HPDLC material system are P-polarization sensitive that polarization will be assumed for the purposes of describing the invention. The transmission grating 43 is advantageously a conventional transmission Bragg grating recorded in a holographic photopolymer. However, other equivalent means for providing a transmission grating may be used. Desirably, the contact image sensor uses infrared light from at least one laser. In one embodiment of the invention the light wavelength is 785 nanometres. A cross sectional view (in the XZ plane) of the waveguiding structure is shown in FIG. 2 which illustrates the waveguiding structure 40 sandwiched by the barrier film 40C and the clad layer 51 (or bottom buffer). A core 71 and a region of cladding 72 between adjacent cores are indicted in the drawing.

In functional terms the first SBG device 20 comprises an array of strips or columns aligned normal to the light propagation direction of the TIR light. The second SBG array also comprises an array of strips or columns aligned parallel to the strips in the first SBG device. The SBGs in the first and second SBG arrays are recorded as single continuous element in each case. Transparent electrodes are applied to the opposing surfaces of the substrates 21,22 with at least one electrode being patterned to define the SBG elements. As explained above each SBG element in the first and second SBG arrays has a diffracting state when no electric field is present across the ITO electrodes and a non-diffracting state when an electric field is present across the ITO electrodes, the SBG elements diffracting only the first polarization light. Transparent electrodes are applied to the opposing faces of the third transparent substrate and the waveguiding layer with at least one electrode being patterned to define the SBG elements. Typically the first SBG array has a resolution of 1600 elements. The resolution of the second SBG array is lower, typically 512 elements.

The column elements of the first and second SBG arrays have longer dimensions disposed orthogonally to the first TIR beam direction. The elements of the second SBG device which are in a non-diffracting state have a generally lower refractive index than the waveguide cores. The third transparent substrate has a generally lower refractive index than the cores. At any time one element of the first SBG array is in a diffracting state, one element of the second SBG array is in a diffracting state, all other elements of the first and second SBG arrays are in a non-diffracting state.

In the embodiment of the invention illustrated in FIG. 1 all of the above described layers (apart from the air gap 23 between the upper substrate 21 of the first SBG and the transmission grating 43) are in contact forming a laminated structure. It should be noted that the relative dimensions of the various layers are greatly exaggerated in the drawing. In one embodiment of the invention the air gap 23 may be replace by a refracting material layer.

The second SBG array 4 acts as the lower cladding layer of the wave guiding structure while the waveguide core 50 and the third transparent substrate 41 act as the containing substrates of the second SBG array device 4. The first and second transparent substrates 21,22 sandwiching the first SBG array together provide a first TIR light guide with the TIR occurring in the plane of the drawing. The second SBG array device 4 is sandwiched by the waveguide core and the third transparent substrate 41 which form a second TIR light guide.

The contact image sensor further comprises a means 11 for coupling light from said illumination means 1 into the first SBG array lightguide. The invention does not assume any particular coupling means. One particular solution discussed later is based on prismatic elements. In one embodiment of the invention the coupling means may be based on gratings. The contact image sensor further comprises a means for coupling light out of the wave-guiding structure into an output optical path leading to a detector. The coupling means which schematically represented by the dashed line 52 is advantageously a grating device which will be discussed in more detail later.

Figures 3A, 3B:
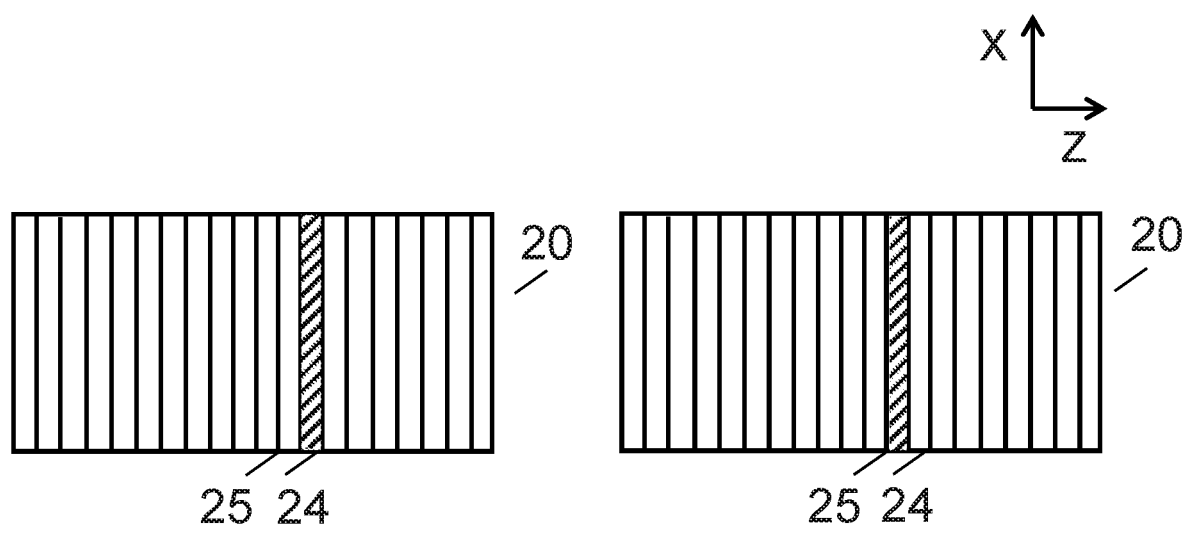
FIG. 3A is a schematic plan view of a first operational state of an SBG device used in a first embodiment of the invention.
FIG. 3B is a schematic plan view of a second operational state of an SBG device used in a first embodiment of the invention.

The column elements of the first and second SBG arrays are switched sequentially in scrolling fashion, backwards and forwards. In each SBG array the SBG elements are switched sequentially across the SBG array and only one SBG element in each array is in its diffracting state at any time. The effect is to produce a narrow scanning column of light that sweeps backwards and forwards across the platen. The disposition of the SBG elements in the first SBG array is illustrated in FIGS. 3A-3B which provide schematic plan views of the SBG array 20 at two consecutive switching states. In the first state illustrated in FIG. 3A the SBG element indicated by 25 is in its diffracting state and all other SBG elements are in their non-diffracting states allowing TIR light to be transmitted through the arrays without substantial transmission loss or path deviation. In the second state illustrated in FIG. 3B the SBG element 24 is switched to its non-diffracting stated while the adjacent element 25 is switched to its diffracting state.

Figure 4:
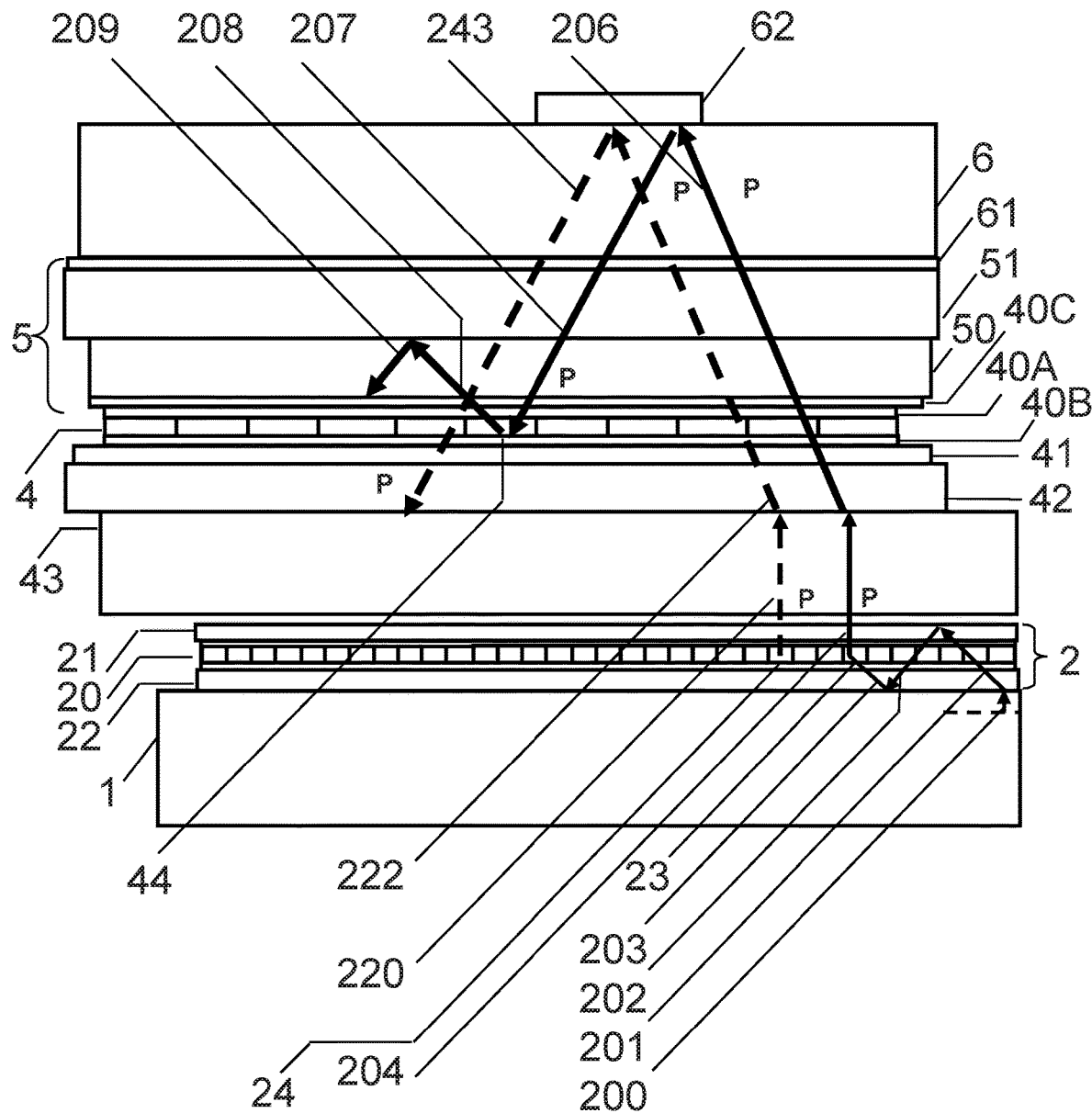
FIG. 4 is a schematic side elevation view of a contact image sensor in a first embodiment of the invention showing the principle ray paths.

We next discuss the operation of the device with reference to the schematic side elevation views of FIG. 4-5 by considering the path of P-polarized collimated light through the device in the plane of each drawing. Incident light 200 from the illuminator means 1 is coupled into the first SBG device 2 by a coupling means indicated by 11 which will be discussed below. The light undergoes TIR in the light guide formed by the substrates 21,22 as indicted by the rays 201-203. The active (i.e., diffracting) SBG column element 23 diffracts light 204 out of the light guide The light 204 is now diffracted by the transmission grating into the ray 206 which propagates towards the platen without significant deviation or loss through the intervening optical layers. The symbol P indicates that the light is P-polarized i.e., it retains the polarization of the input laser light.

During a scan the fingers are placed onto the scanner surface. In the absence of finger contact the light incident on the platen outer surface is totally internally reflected downwards towards the wave guiding structure 50 and then on to the detector. When finger contact is made the finger skin touching the platen surface causes reflection at the outer surface of the platen to be frustrated such that light leaks out of the platen. The parts of the finger skin that touch the platen surface therefore becomes the dark part of the finger print image because light never makes it to the detector array. The X coordinate of the contacting feature is given by the detector array element providing the dark-level or minimum output signal. The latter will be determined by the noise level of the detector. The Y coordinate of the contacting feature is computed from the geometry of the ray path from the last SBG element in the first SBG array that was in a diffracting state just prior to TIR occurring in the platen and a signal from the reflected light being recorded at the detector. The ray path is computing using the diffraction angle and the thicknesses and refractive indices of the optical layers between the SBG element and the platen surface.

In one embodiment of the invention an alternative detection scheme based on the principle that in the absence of any external pressure art the platen/air interface the incident light is transmitted out of the platen. Now, external pressure from a body 62 of refractive index lower than the platen (which may a feature such as a finger print ridge or some other entity) applied on the outer side of the platen layer causes the light to be totally internally reflected downwards towards the wave guiding structure 50. Hence the X coordinate of the contacting feature is now given by the detector array element providing the peak output signal. The procedure for computing the Y coordinate remains unchanged.

An SBG when in the state nominally designated as "non-diffracting" will in practice have a very small refractive index modulation and will therefore diffract a small amount of light. This residual diffraction is negligible in most applications of SBGs. However, in applications such as the present sensor any residual refractive modulation will result in a small light being diffracted out of the light guide. For example referring to FIG. 4 SBG elements such as 24 will have a small diffraction efficiency leading to a small portion of TIR light being diffracted upwards into the ray path represented by the dashed lines and the ray directions indicated by 220-223. This light will follow a parallel oath to the light from the active SBG element (the signal light) and will be reflected off the platen outer surface towards the waveguides. Coupling of this stray light into the waveguides where it will contribute a background leakage noise to the output signal is prevented by switching the second SBG array elements in synchronization with the first array elements such that only the element of the first and second SBGs array lying on the signal ray path are in a diffracting state at any time. The readout of the signal from detector array is in turn synchronised with the switching of the elements of the first and second SBG arrays.

Aspects of the Waveguiding Structure

The wave guiding structure 50 and the SBG array 4 together provide the means for coupling light out of the sensor onto a detector array. The SBG provides the lower clad and the clad layer 51 provides the upper clad. The coupling of light into the waveguide relies on the second SBG array which acts as a switchable cladding layer as will be discussed below. The second SBG array is operated in a similar fashion to the first SBG array with column elements being switched sequentially in scrolling fashion, backwards and forwards. Only one SBG element is in a diffracting state at any time. The non active elements perform the function of a clad material. The role of the active SBG element is to steer incident ray into the TIR angle. It should be appreciated that in order that light reflected down from the platen can be diffracted into a TIR path by an active (diffracting) SBG element the refractive index of the SBG in its active state must be lower than the core index. To maintain TIR the refractive index of the SBG elements that are not in their diffracting states must be lower than that of the core. The operation of the waveguiding structure will now be explained more clearly referring to FIG. 5A which shows a detail of the wave guiding structure including the clad 51 core 50 second SBG array 4 and SBG substrate 41. Note that inn FIGS. 5A-5B the layers 40A,40B,40C are not illustrated. For the sake of simplifying the description the refraction of light at the optical interfaces will be ignored. The SBG grating is represented by the single Bragg fringe 44. The ray 207 on entering the active SBG element 43 at an incidence angle w is diffracted into the ray 207A. The deflection of the ray is determined by the Bragg diffraction equation. Since the average index of the SBG medium is higher than that of the substrate layer 41 the diffracted ray 207A undergoes TIR within the SBG medium and the reflected ray 208 propagates into the core at an angle u which is slightly higher than the critical angle of the core/clad interface. The angle u is determined by the slant angles of the Bragg fringes and the incidence angle w. The ray 208 undergoes TIR to give the downward ray 209 which enters the non-diffracting SBG element 45 at the angle u as the ray 210. The ray 210 undergoes TIR at the interface of the SBG element/third substrate and re-enters the core as the ray 211 which from reflection symmetry is at angle u. This process is repeated along the waveguide until the light is coupled out towards the detector. Since all of the remaining SBG elements along the waveguide path are in their non-diffracting states TIR between the clad layer and the SBG lower substrate continues until the light is couple out of the waveguide towards the detector.

The invention also covers the case where the SBG substrate abuts a low index slab 42 which has a lower index than the third substrate. The layer 42 is not essential in all applications of the invention but will in general provide more scope for optimising the optical performance of the sensor. Referring to FIG. 5B it will be seen that the ray paths are similar to those of FIG. 5A except that the TIR of the diffracted ray 207A now takes place at the interface between the substrate 41 and the low index slab 42. Accordingly, the diffracted ray 207A is transmitted into the substrate 41 as the ray 207B and undergoes TIR into the ray 207C at the low index layer after transmission through the substrate 41 and the SBG array 4 the ray now indicated by 208A propagates into the core at an angle v which is slightly higher than the critical angle of the core/clad interface. The ray 208A undergoes TIR to give the downward ray 209A which enters the non activated SBG element 45 as the ray 210A. The ray 210A undergoes TIR at the low index layer and re-enters the core as the ray 211A which from reflection symmetry is at angle v. This process is repeated along the waveguide until the light is coupled out towards the detector. It should be appreciated that in situations where the collimation of the beam is not very tightly controlled it is possible that TIR may occur at the SBG substrate index for some rays and at the low index slab substrate for other rays.

In one embodiment of the invention the third transparent substrate has a generally lower refractive index than an element of the second SBG array in its diffracting state.

In one embodiment of the invention the third transparent substrate has a generally lower refractive index than the element of the second SBG array in its non-diffracting state.

Figure 5A:
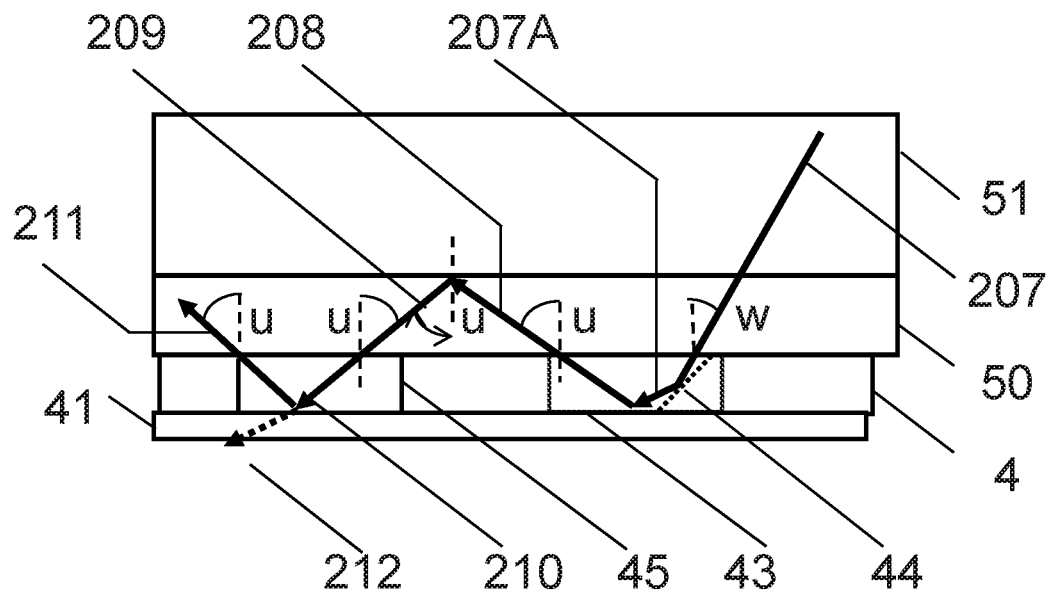
FIG. 5A is a schematic side elevation view of a detail of the contact image sensor showing the ray propagation through the waveguide core and second SBG array in one embodiment of the invention.
Figure 5B:
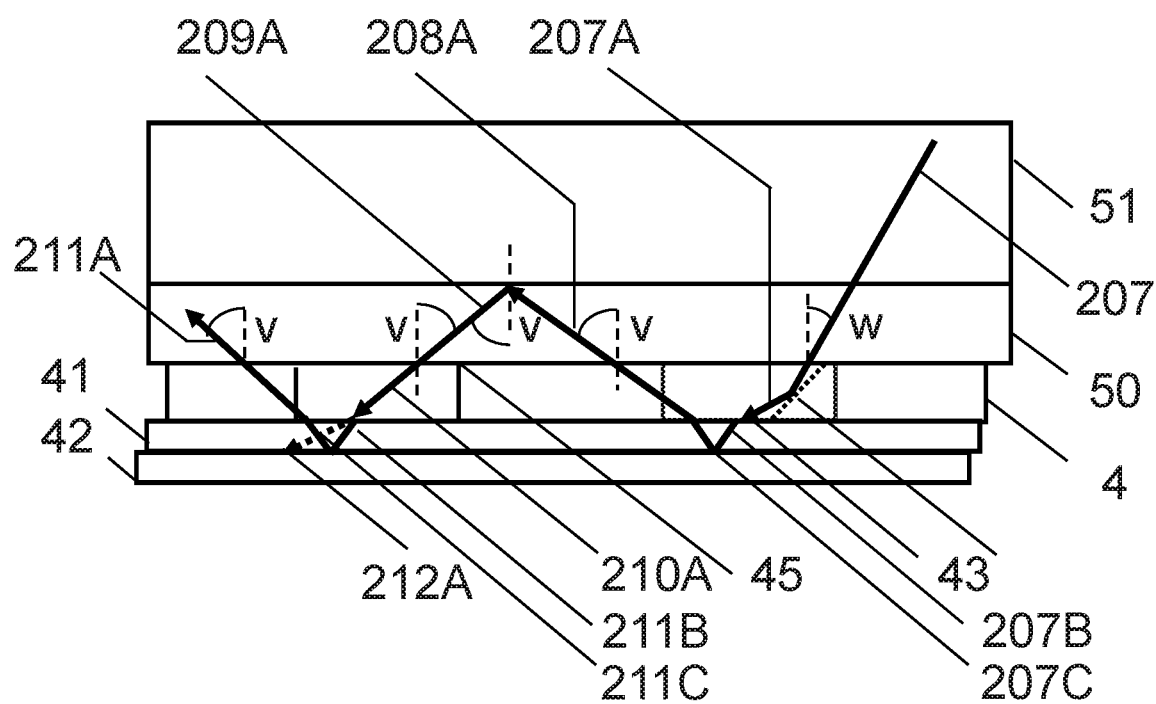
FIG. 5B is a schematic side elevation view of a detail of the contact image sensor showing the ray propagation through the waveguide core and second SBG array in one embodiment of the invention.

As indicated in FIGS. 5A-5B the cleared SBG will still have a small residual refractive index modulation causes a small amount of the incident light to be diffracted. The direction of diffraction will depend on the TIR angle. The ray is not at the Bragg angle but may be sufficiently close to the Bragg angle to be diffracted with a lower diffraction efficiency. If not diffracted it may contribute to the TIR beam, contributing to the output signal.

The wave-guiding structure 50 is illustrated in schematic plan view in FIG. 1 and in cross section in FIG. 2. It will be seen that the wave-guiding structure 50 comprises multi-plicity of parallel strip waveguides generally indicated by 70, the waveguide core element 71 of one of the waveguides being and the surrounding cladding being indicated by 72. The invention does not assume any particular waveguide geometry or material for fabricating the waveguiding layer. It will be recognized that there is a large number of core/cladding combinations that can be successfully be used for the invention. Many possible design solutions will be known to those skilled in the art of integrated optics. Typically, the core will have a refractive index of typically between 1.51 to 1.56 or and the cladding layers will have refractive indices of 1.41 to 1.47. Typically the core may be rectangular with cross sectional dimensions of 25-40 microns in depth×40 microns in width.

The wave-guiding structure may use a polymer waveguide core of index typically in the range 1.50 to 1.60 with cladding index typically 1.45 to 1.55. However, the invention does not assume any particular waveguide optical materials. It should be noted by the waveguide cladding in the waveguiding layer 51 and the cladding layer 51 may be fabricated from one material. In some cases it may be advantages to have more than one cladding material in order to provide better control of the guide wave mode structure. The highest refractive index UV curable material suitable for use as either core or clad in a high transparency waveguiding structure of the type required in the invention is believed to have a refractive index of about 1.56 at 633 nm. The index might be slightly lower at longer wavelength. The problem with index values above about 1.56 is that the materials become either coloured or slightly metallic and hence lose their transparency. Higher index transparent materials exist but they are not UV curable, which makes them unsuitable for waveguide fabrication using currently available embossing process.

We next discuss the means for coupling light out of the wave-guiding structure into an output optical path leading to a detector. The coupling scheme which was only indicated schematically by the symbol 52 in FIG. 1 may be based on well known methods using grating couplers, prismatic elements etc. The invention does not rely on any particular method.

Figure 6:
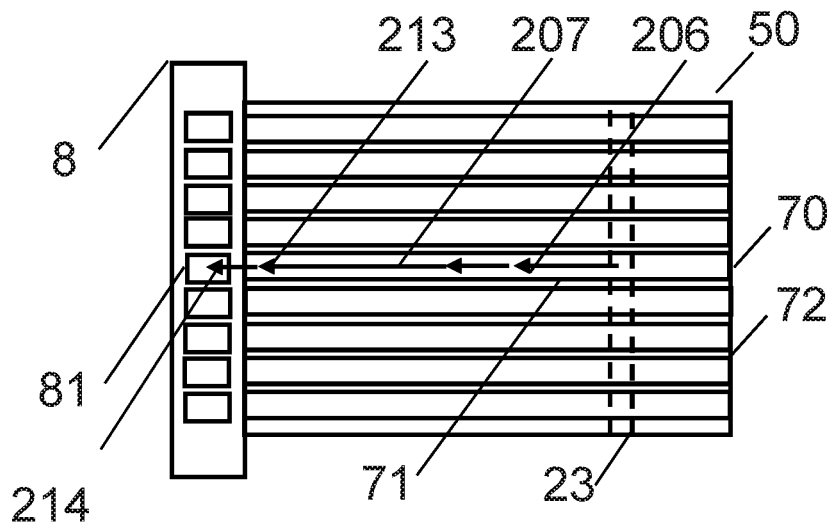
FIG. 6 is a schematic plan view of a wave-guiding structure and detector module used in one embodiment of the invention.
Figure 7:
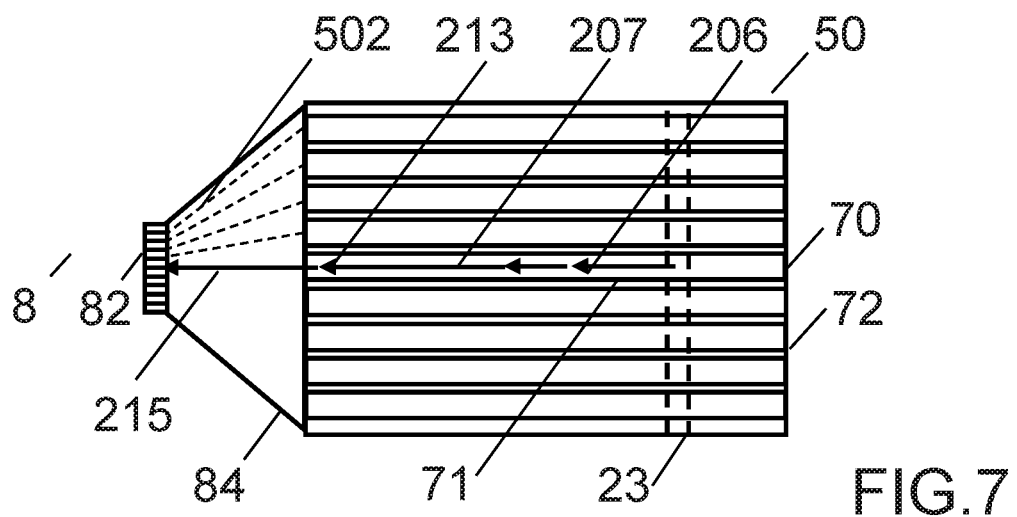
FIG. 7 is a schematic plan view of a wave-guiding structure and detector module used in one embodiment of the invention.
Figure 8:
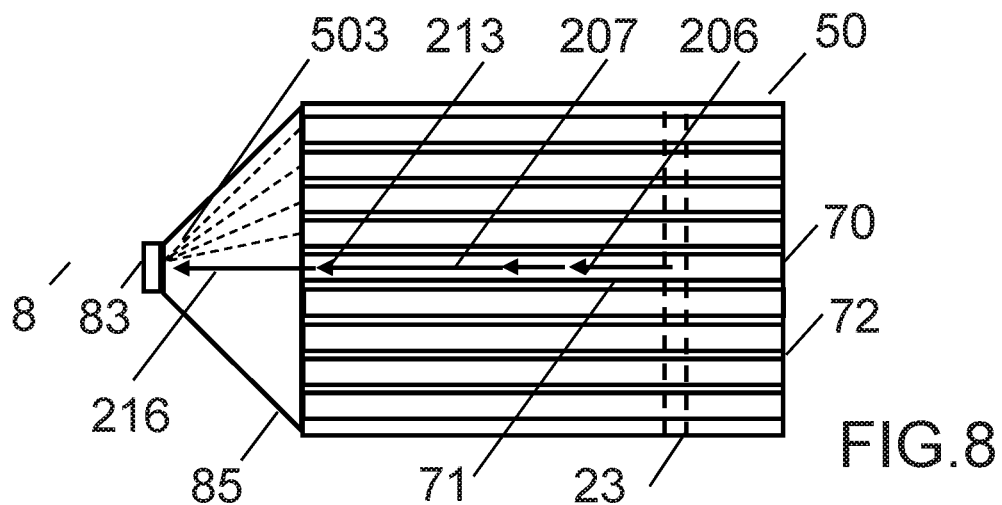
FIG. 8 is a schematic plan view of a wave-guiding structure and detector module used in one embodiment of the invention.

FIGS. 6-8 provide schematic plan views of alternative schemes for coupling the wave guiding structure 50 to the detector 8. The detector comprises at least one element. A multiplicity of waveguide cores is generally indicated by 70 with a typical core element 71 and the surrounding cladding 71 being indicated in each case. Each core terminates at a coupler linked to a detector element. In each case the ray paths from the active SBG element 23 to the waveguide termination are indicated by 206,207,213 using the numerals of FIG. 4.

In the embodiment of FIG. 6 the detector 8 is a linear array of elements such as 81. A ray path from the waveguide termination to the detector is indicated by 214. Advantageously, the cores are each terminated by a 45 degree facet with directs light upwards or downwards (relative to the drawing surface) towards the detector along direction 214 which should be read as normal to the plane of the drawing.

The detector pitch matches the core spacing. In one embodiment of the invention a parallel path waveguide routeing element may be provided between the waveguide termination and the detector.

In the embodiment of FIG. 7 the output light paths generally indicated by 502 from the waveguides are converged onto a linear detector array that is much smaller than the width of the platen by means convergent path waveguide routing element 84A. In one embodiment of the invention the cores are terminated by a 45 degree facet which directs the light upwards or downwards.

In the embodiment of FIG. 8 the output light paths generally indicated by 503 from the waveguides are converged by means of a convergent path waveguide routing element 85 onto a single element detector 83. In one embodiment of the invention the cores are terminated by a 45 degree facet which directs the light upwards or downwards.

Many different schemes for providing the waveguiding routeing elements referred to above will be known to those skilled in the art of integrated optical systems. The apparatus may further comprise a microlens array disposed between the waveguide ends and the detector array where the microlens elements overlap detector elements.

Figure 9:
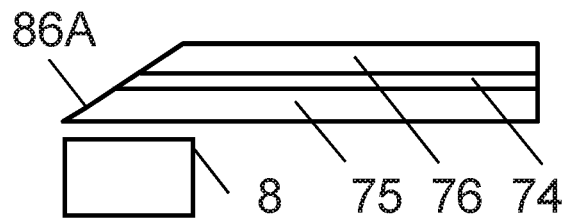
FIG. 9 is a schematic side elevation view of a detection scheme based on terminating waveguides in the wave-guiding structure with an angled polished facet as used in one embodiment of the invention.

FIG. 9 is a schematic side elevation view of one method of coupling light out of the wave-guiding structure in which there is provided a 45 degree facet 86A terminating each waveguide element in the wave-guiding structure. FIG. 9 may be a cross section of any of the schemes illustrated in FIGS. 7-9. The detector 8 and the waveguide cladding layers 75,76 and core 74 are illustrated. The core 74 may be a continuation of one of the cores 70 or a core of material of similar optical properties optically coupled to one of said cores 70. The cladding layer may be a continuation of the cladding layer 51 in FIG. 1 and FIG. 3 or material of similar refractive index. The cladding layer may be continuation of the HPDLC material of the SBG array 4 or material of similar refractive index to the SBG array in its non active state.

Figure 10:
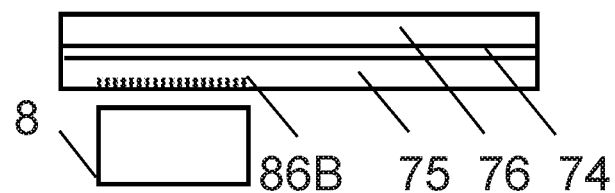
FIG. 10 is a schematic side elevation view of a detection scheme based on applying out coupling gratings to waveguides in the wave-guiding structure as used in one embodiment of the invention.

FIG. 10 is a schematic side elevation view of another method of coupling light out of the wave-guiding structure in which a grating device 86B is applied to each waveguide element. FIG. 9 may be a cross section of any of the schemes illustrated in FIGS. 7-9. The grating may be a surface relief structure etched into the waveguide cladding. Alternatively, the grating may be a separate layer in optical contact with one or both of the core or cladding. In one embodiment of the invention the grating may be recorded into a cladding layer as a Bragg grating.

Figure 11:
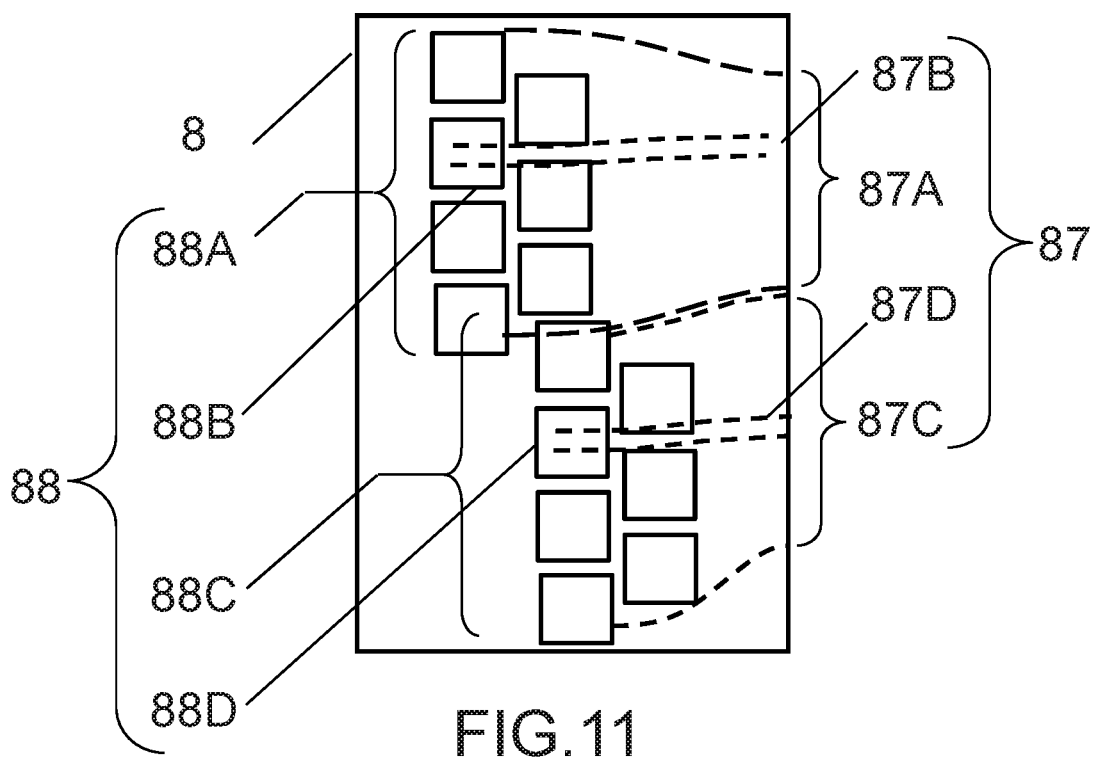
FIG. 11 is a schematic plan view of a detection scheme based on a two dimensional array used in one embodiment of the invention.

In the above described embodiments of the invention the detector 8 is a linear array. In an alternative embodiment of the invention illustrated in FIG. 11 the detector elements are distributed over two dimensions. This avoids some of the alignment problems of coupling waveguide elements to detector elements with a very high resolution linear array. The waveguides from the wave-guiding structure generally indicated by 87 are fanned out in the waveguide groups 87A,87C. The detectors are generally indicated by 88. The waveguide groups 87A,87C contain waveguide cores such as 87B which overlays the detector 88B in the detector group 88A and waveguide 87D which overlays the detector 88D in the detector group 88C. The waveguide to detector computing may employ 45 degrees core terminations, gratings, prisms or any other methods known to those skilled in the art. From consideration of FIG. 11 it should be apparent that many alternative configurations for coupling the waveguiding structure to a two dimensional detector array are possible.

In practical embodiments of the invention the beams produced by the illumination means will not be perfectly collimated even with small laser die and highly optimised collimating optics. For this reason the interactions of the guided beams with the SBG elements will not occur at the optimum angles for maximum Bragg diffraction efficiency (DE) leading to a small drop in the coupling efficiency into the waveguiding structure. Having coupled light into the waveguiding structures there is the problem that some of the light may get coupled out along the TIR path by the residual gratings present in the non-diffracting SBG elements. The reduction in signal to noise ratio (SNR) resulting from the cumulative depletion of the beam by residual gratings along the TIR path in the output waveguide may be an issue in certain applications of the invention. A trade-off may be made between the peak and minimum SBG diffraction efficiencies to reduce such out-coupling. The inventors have found that minimum diffraction efficiencies of 0.02% are readily achievable and 0.01% are feasible. To further reduce the risk of light being coupled out of the waveguiding structure, a small amount of diffusion (~0.1%) can be encoded into the SBG to provide a broader range of angles ensuring that guided light is not all at the Bragg angle. A small amount of diffusion will be provided by scatter within the HPDLC material itself. Further angular dispersion of the beam may also be provided by etching both the ITO and the substrate glass during the laser etching of the ITO switching electrode.

In one embodiment of the invention the refractive index modulation of second SBG array is varied along the length of the array during exposure to provide more uniform coupling along the waveguide length. The required variation may be provided by placing a variable neutral density filter in proximity to the SBG cell during the holographic recording. In any case the power depletion along the waveguide can be calibrated fairly accurately.

Only light diffracted out of the active element of the first SBG array should be coupled into the output waveguide structure at any time. The gaps between the elements of the first SBG arrays should be made as small as possible to eliminate stray which might get coupled into the waveguiding layer reducing the SNR of the output signal. Ideally the gap should be not greater than 2 micron. The noise is integrated over the area of an active column element of the second SBG array element while the signal is integrated over the simultaneously active column element of the first SBG array. An estimate of SNR can be made by assuming a common area for the first and second SBG arrays and making the following assumptions: number of elements in the second SBG array: 512; number of elements in first SBG Array: 1600; SBG High DE: 95%; and SBG Low DE: 0.2%. The SNR is given by [Area of second SBG array element× DE (High)]/[Area of SBG element×DE (Low)]=[1600× 0.95]/[52×0.02]=148. Desirably the SNR should be higher than 100.

In one embodiment of the invention the transparent electrodes are fabricated from PDOT (poly ethylenedioxythiophene) conductive polymer. This material has the advantage of being capable of being spin-coated onto plastics. PDOT (and CNT) eliminates the requirement for barrier films and low temperature coating when using ITO. A PDOT conductive polymer can achieve a resistivity of 1000 hm/sq. PDOT can be etched using Reactive Ion Etching (RIE) processes.

In one embodiment of the invention the first and second SBG arrays are switched by using a common patterned array of column shaped electrodes. Each element of the second SBG array, which is of lower resolution than the first SBG array uses subgroups of the electrode array.

In one embodiment of the invention the waveguides are fabricated from PDOT. The inventors believe that such a waveguide will exhibit high signal to noise ratio (SNR).

In one embodiment of the invention the waveguides are fabricated from CNT using a lift-off stamping process. An exemplary CNT material and fabrication process is the one provided by OpTIC (Glyndwr Innovations Ltd.) St. Asaph, Wales, United Kingdom.

In one embodiment of the invention the waveguide cores are conductive photopolymer such as PDOT or CNT. Only the portions of the SBG array lying directly under the waveguide cores are switched. This avoids the problems of crosstalk between adjacent waveguide cores thereby improving the SNR at the detector.

Optical Material Considerations

In one embodiment of the invention used for finger print detection using 785 nm light the TIR angle in the platen must take into account the refractive index of perspiration. For example if the platen is made from SF11 glass the refractive index at 785 nm is 1.765643, while the index of water at 785 nm is 1.3283. From Snell's law the arc-sine of the ratio of these two indices (sin-1 (1.3283/1.76564) gives a critical angle of 48.79°. Allowing for the salt content of perspiration we should assume an index of 1.34, which increases the critical angle to 49.37°. Advantageously, the TIR angle at the platen should be further increased to 50° to provide for alignment tolerances, fabrication tolerances, and water variations as well as collimation tolerances too for less than perfect lenses and placements of these parts. Alternatively, other materials may be used for the plate. It is certainly not essential to use a high index to achieve moisture discrimination. One could use an acrylic platen (index 1.49), for example, where the ray angle is in the region of 65°. In practice, however, the choice of platen material will be influenced by the need to provide as large a bend angle as possible at the SBG stage. The reason for this is that higher diffraction efficiencies occur when the bend angle (ie the difference between the input angle at the SBG and the diffracted beam angle) is large. Typically bend angles in the region of 20-25 degrees are required.

In one embodiment of the invention the platen may be fabricated from a lower refractive material such as Corning Eagle XG glass which has a refractive index of 1.5099. This material has the benefit of relatively low cost and will allow a sufficiently high TIR angle to enable salty water discrimination. Assuming the above indices for perspiration (salt water) of 1.34 and water of 1.33 this gives critical angle for salt water of 62.55777 degrees and a critical angle for water of 61.74544 degrees.

In one embodiment of the invention the indices of the SBG substrates and the element 42 are all chosen to be 1.65 and the platen index is chosen to be 1.5099. The material used in the low index layer 42 is equal in index to the SBG substrates, or slightly lower. The TIR angle in the SBG layer is 78 degrees. At this index value the diffracted beam angle with respect to the surface normal within the upper SBG substrate will be 55 degrees. For a TIR angle of 78 degrees in the SBG the effective diffraction bend angle is 23 degrees. The TIR angle in the platen based on the above prescription is 63.5 degrees allowing for typical refractive index tolerances (ie a 0.001 refractive index tolerance and 0.3 degree minimum margin for glass tolerances).

The above examples are for illustration only. The invention does not assume any particular optical material. However, the constraints imposed by the need for perspiration discrimination and the bend angles that can be achieved in practical gratings will tend to restrict the range of materials that can be used. Considerations of cost, reliability and suitability for fabrication using standard processes will further restrict the range of materials.

The required refraction angles in any layer of the sensors can be determined from the Snell invariant given by the formula n.sin (U)=constant where n is the refractive index and U is the refraction angle. Typically the constant will be set by the value of the Snell invariant in the platen. For example if the platen index is 1.5099 and the critical angle is 63.5° the Snell invariant is 1.5099×sin) (63.5°=1.351. The only exception to this rule will be the cases where diffraction occurs at elements of the SBG arrays or the transmission grating where the change in angle will defined by the respective grating prescriptions.

In the embodiment of FIG. 1 there is an air gap between the first SBG array 2 and the transmission grating. Other air gaps may be provided between other layers in the sensor architecture subject to the restrictions imposed by the Snell invariant and the diffraction bend angle as discussed above.

The invention requires tight control of refractive index and angle tolerances to maintain beam collimation otherwise cross talk between adjacent waveguides may occur leading to output signal ambiguities. Index variations: of 0.001 may lead to TIR boundaries shifting by around 0.25 deg for example. Angular tolerances are typically 0.1 deg in transmission. At reflection interfaces the angular error increases. In the worst case a ray will experience reflections off five different surfaces. Note that the TIR paths used in the sensor can typically have up to 18 bounces. The effects of a wedge angle in the substrates will be cumulative. For examples a 30 seconds of arc wedge may lead to a 0.3 degree error after 18 bounces. Desirably the cumulative angular errors should allow a margin for TIR of at least 1 deg.

Typical refractive indices and layer thicknesses used in the embodiment of FIG. 1 are provided in the table of FIG. 18.

Description of One Particular Embodiment of the Illumination Module

Figure 12A:
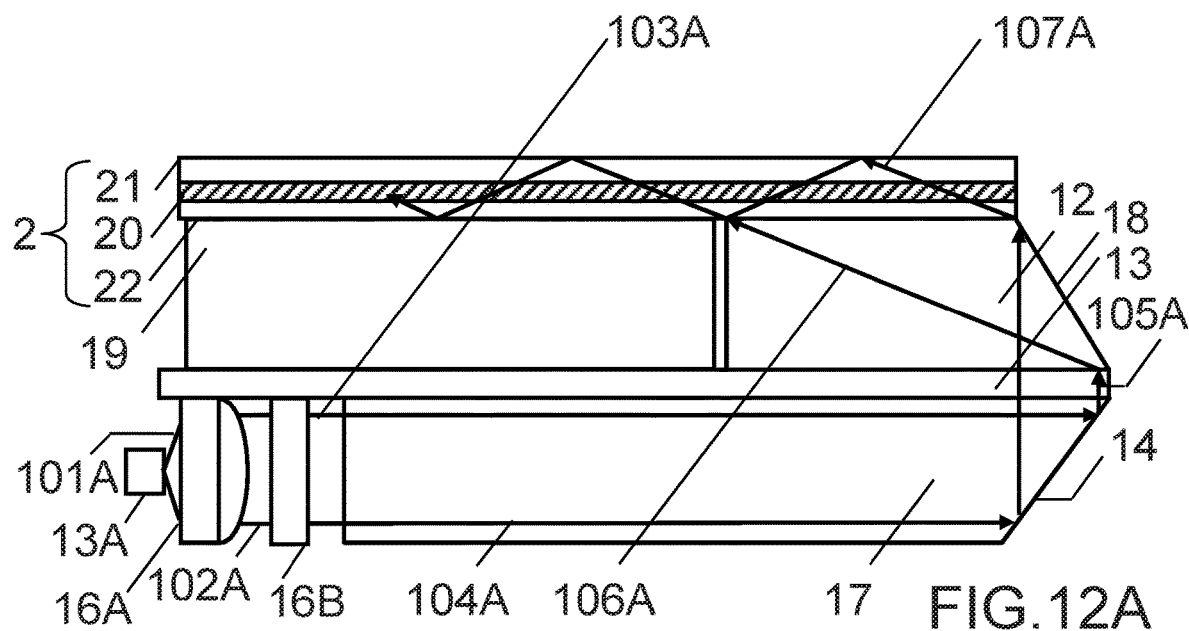
FIG. 12A is a schematic side elevation view of an illumination means in one embodiment of the invention.
Figure 12B:
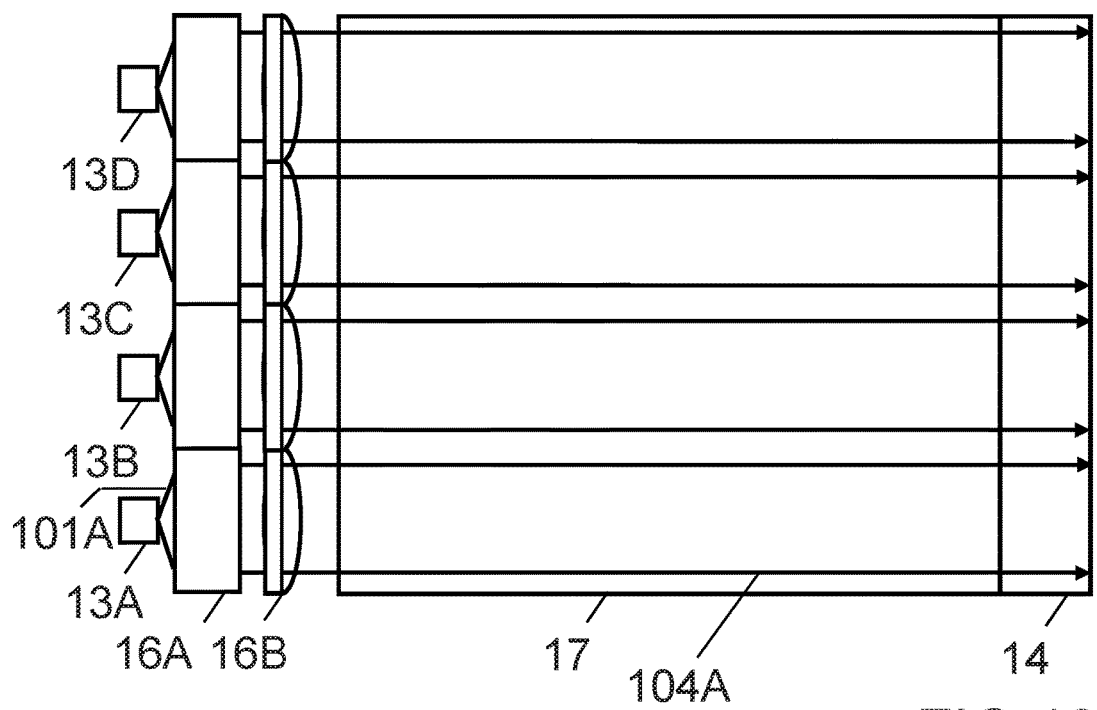
FIG. 12B is a schematic plan view of an illumination means in one embodiment of the invention.

FIG. 12 illustrates the illumination module of the contact image sensor in more detail. FIG. 12A is a schematic side elevation view showing the illumination means and the SBG device in one embodiment of the invention. FIG. 12B provides a side elevation view of the same embodiment of the invention. The wave guiding structure is not illustrated in FIG. 12A. The illumination means comprises a multiplicity of lasers indicated by 13A-13D providing separate parallel illumination modules, each module comprising a pair of crossed cylindrical lenses such as 16A,16B a light guide 17, transparent slabs 12,19 and transparent substrate 13. The slabs 12,19 abut the first SBG array 2 comprising the transparent substrates 21,22 sandwiching the SBG layer 20. In one embodiment of the invention the lenses 16A,16B may be crossed cylindrical lenses such that the first lens 16A collimates the input light 101A to provide a first beam 102A that is collimated in a first plane and the second lens 16B collimates the beam 102A in the orthogonal plane to provide a beam 103A collimated in a second plane orthogonal to the first plane such that the resulting beam in the light guiding element 17 is collimated in both beam planes. Advantageously, the lenses are of rectangular cross section. The beams from the lasers 13A-13D are identical and abut to form a continuous rectangular beam extending over an area substantially the same as the first SBG array in plan view. The lightguide element 17 comprises a transparent slab with a planar input surface orthogonal to the beam direction and a reflecting surface 14 at an angle to the beam direction. The surface 14 reflects the beam 104A into the direction 105A orthogonal to 104A. Although the slab portions 12 and 19 are illustrated as being air separated they may abut. The slab 12 has a tilted reflecting surface 18 for directing light 106A into the SBG array device 2. In one embodiment of the invention the slab 12 has an identical refractive index to the substrates 21,22 sandwiching the SBG array 20. The slab 19 essentially performs the function of a spacer. The slab 13 also acts as spacer. In one embodiment of the invention the slab 13 is coated with a polarization selective coating in the region illuminated by the upward propagating light reflected off the mirror surface 14. The refractive index of the slab 19 is chosen to ensure that rays such as 106A,107A entering the first SBG array device exceed the critical angles for TIR within the light guide formed by the first SBG array device. The reflective surfaces 14,18 essentially provide the coupling means indicated schematically by the symbol 11 in FIG. 1 It should be apparent to those skilled in the art of optical design that in other embodiments of the invention other equivalent optical configurations including diffractive optical surfaces may be used to perform the function of the surfaces 14 and 18. Typically, the SBG array an average refractive index of 1.55 in its non-diffractive state and 1.62 when in a diffracting state. The substrates 21,22 have refractive indices of 1.55. The slab 12 has an index of typically between 1.5 and 1.7 to match the SBG substrates. The slab 19 is advantageously a polymer material of refractive index 1.49. The resulting critical angle in the first TIR light guide formed by the first array SBG device is therefore approximate 74 degrees.

Figure 13:
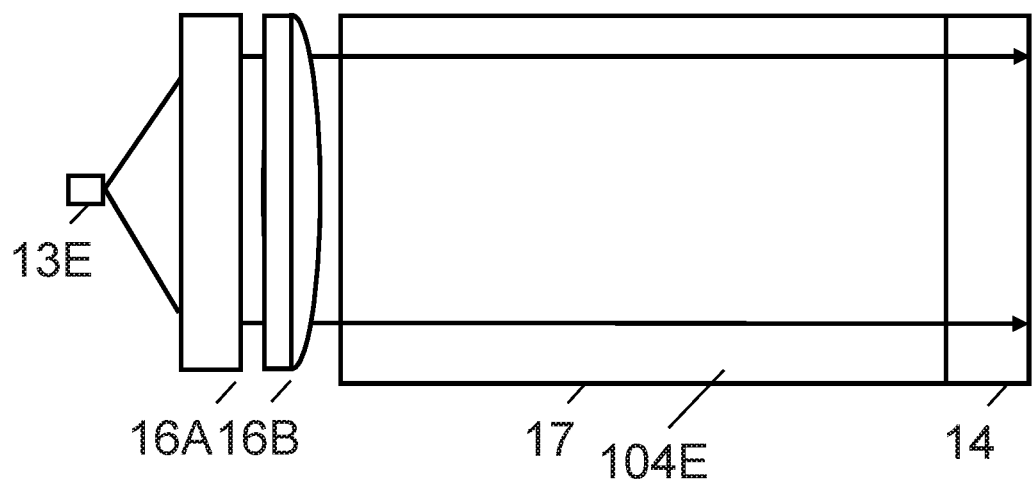
FIG. 13 is a schematic plan view of an illumination means in one embodiment of the invention.

In one embodiment of the invention illustrated in the schematic plan view of FIG. 13 the illumination means comprises a single laser 13E and a collimator lens system comprising the crossed cylindrical lenses 46a,46b. The said illumination means provides a single collimated beam of rectangular cross section 104E.

Embodiments Using Plastic SBGs

A sensor according to the principles of the present application may fabricated using the HPDLC material system and processes disclosed in a U.S. Pat. No. 9,274,349, entitled IMPROVEMENTS TO HOLOGRAPHIC POLYMER DISPERSED LIQUID CRYSTAL MATERIALS AND DEVICES which is incorporated by reference herein in its entirety.

The SBG substrates may be fabricated from polycarbonate, which is favored for its low birefringence. Two other currently available plastic substrates materials are a cyclic olefin copolymer (COC) manufactured by TOPAS Advanced Polymers and sold under the trade name TOPAS. The other was a cyclic olefin polymer (COP) manufactured by ZEON Corporation and sold under the trade names ZEONEX and ZEONOR. These materials combine excellent optical properties (including high transmission and low birefringence) with excellent physical properties (including low specific gravity, low moisture absorption, and relatively high glass transition temperature). The inventors have found that an adequate diffraction efficiency (i.e. ≥70%) can be obtained when using plastic substrates. The diffraction efficiency compares favorably with glass. The switching time of plastic SBG is also found to be sufficient to produce satisfactory devices.

Transparent conductive (ITO) coatings applied to the above plastics have been found to be entirely satisfactory, where satisfactory is defined in terms of resistivity, surface quality, and adhesion. Resistivity values were excellent, typically around 1000/square. Surface quality (i.e., the size, number and distribution of defects) was also excellent. Observable defects are typically smaller than 1 micron in size, relatively few in number, and sparsely distributed. Such imperfections are known to have no impact on overall cell performance. ITO suffers from the problem of its lack of flexibility. Given the rugged conditions under some SBG devices may operate, it is desirable to use a flexible TCC with a plastic substrate. In addition, the growing cost of indium and the expense of the associated deposition process also raise concerns. Carbon nanotubes (CNTs), a relatively new transparent conductive coating, are one possible alternative to ITO. If deposited properly, CNTs are both robust and flexible. Plus, they can be applied much faster than ITO coatings, are easier to ablate without damaging the underlying plastic, and exhibit excellent adhesion. At a resistivity of 200Ω/sq, the ITO coatings on TOPAS 5013 S exhibit more than 90% transmission. At a resistivity of 230Ω/sq, the CNT coatings deposited on the same substrates material exhibited more than 85% transmission. It is anticipated that better performance will results from improvements to the quality and processing of the CNTs An adhesion layer is required to support the transparent conductive coating. The inventors have found that the adhesion of ITO or CNT directly to plastics such as TOPAS and ZEONEX was poor to marginal. The inventors have found that this problem can be overcome by means of a suitable adhesion layer. One exemplary adhesion layer is Hermetic TEC 2000 Hard Coat from the Noxtat Company. This material has been found to yield a clear, mar-resistant film when applied to a suitably prepared plastic substrate. It can be applied by flow, dip, spin, or spray coating. TEC 2000 Hard Coat is designed to give good adhesion to many thermoplastic substrates that are cast, extruded, molded or blow molded. When applied to TOPAS, ZEONEX or other compatible plastics, the strength and break resistance provided by TEC 2000 is nearly as scratch and abrasion resistant as glass. Hermetic Hard Coat forms a transparent 3-6 micron film on plastic surfaces. The Refractive index of the coating is 1.4902. The next step in SBG cell production process is applying the TCC (ITO or CNT) to the hard coat. The Hard Coat plays two roles in SBG cell production. One is to increase adhesion of the conductive layer to the plastic and prevent degasing during vacuum coating. The second role is to seal the plastic surface from environmental influence. It was found that TEC 2000 Hard Coat performs very well with TOPAS and ZEONEX materials.

Embodiments Using Reverse Mode SBGs

A fundamental feature of SBGs fabricated using current HPDLC material systems is that the grating is present when the device is in its passive state. An electric field must be applied across the HPDLC layer to clear the grating. An alternative HPDLC material system that may be used with the present invention provides a reverse mode SBG in which the grating is clear when in its passive state. A reverse mode SBG will provide lower power consumption. A reverse mode HPDLC and methods for fabricating reverse mode SBG devices is disclosed in a U.S. Pat. No. 9,274,349, entitled IMPROVEMENTS TO HOLOGRAPHIC POLYMER DISPERSED LIQUID CRYSTAL MATERIALS AND DEVICES which is incorporated by reference herein in its entirety.

A Method of Making a Contact Image Measurement

Figure 14:
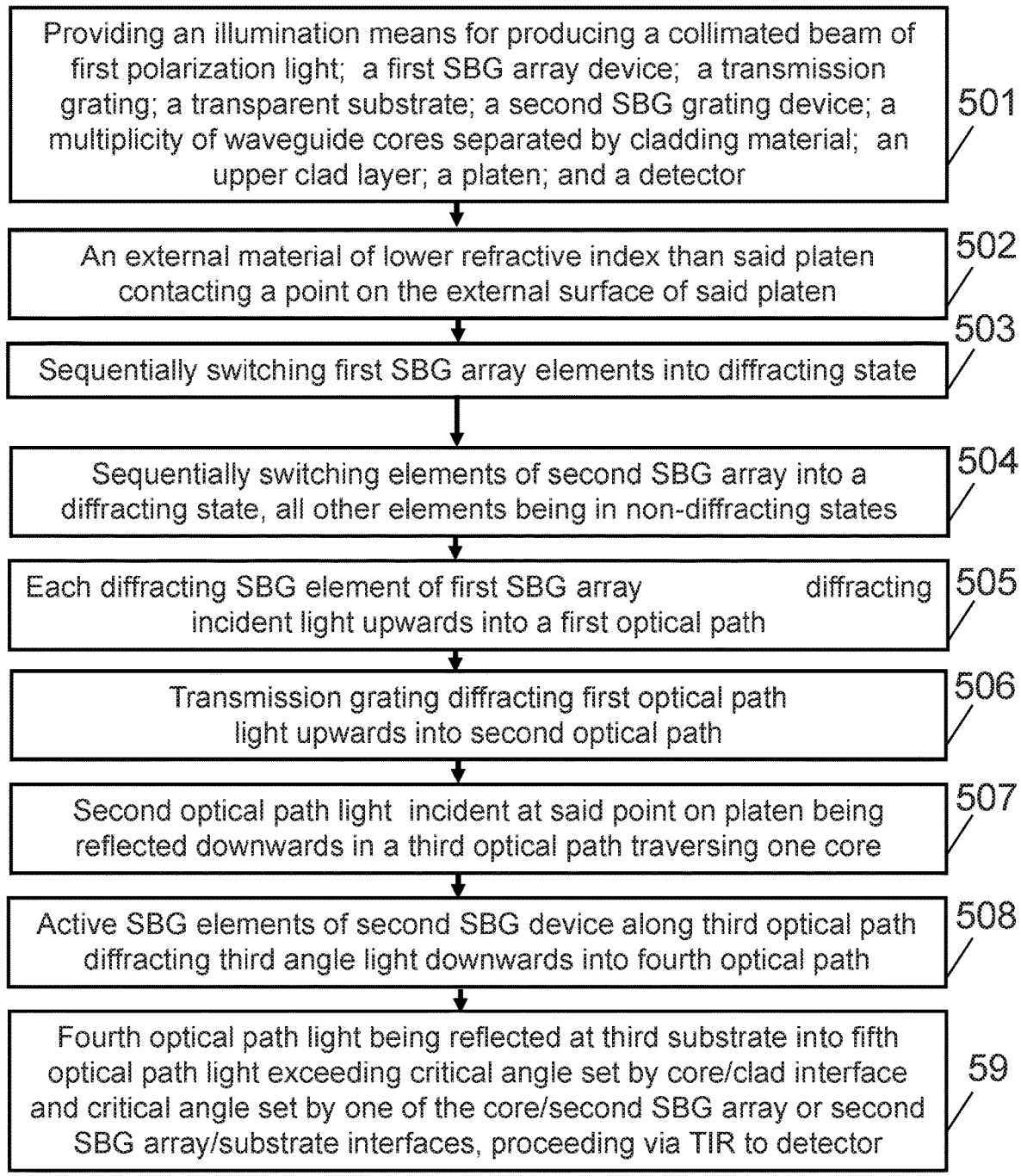
FIG. 14 is a flow chart illustrating a method of making a contact image measurement in one embodiment of the invention

A method of a method of making a contact image measurement in one embodiment of the invention in accordance with the basic principles of the invention is shown in the flow diagram in FIG. 14. Referring to the flow diagram, we see that the said method comprises the following steps.

At step 501 providing an apparatus comprising the following parallel optical layers configured as a stack: an illumination means for providing a collimated beam of first polarization light; a first SBG array device further comprising first and second transparent substrates sandwiching an array of selectively switchable SBG column elements, and ITO electrodes applied to opposing faces of the substrates and the SBG substrates together providing a first TIR light guide for transmitting light in a first beam direction; an air gap; a transmission grating; a third transparent substrate_ (low index glue layer); a SBG cover glass; a ITO layer; a second SBG array device comprising array of selectively switchable SBG column elements; a ITO layer; a barrier film; a waveguiding layer comprising a multiplicity of waveguide cores separated by cladding material having a generally lower refractive index than the cores, the cores being disposed parallel to the first beam direction; an upper clad layer having a generally lower refractive index than the cores (also referred to as the bottom buffer); a priming layer; a platen; and further comprising: means for coupling light from the illumination means into the first TIR light guide; means for coupling light out of the waveguide into an output optical path; and a detector comprising at least one photosensitive element, wherein ITO electrodes are applied to the opposing faces of the substrate and the waveguide core;

At step 502 an external material contacting a point on the external surface of the platen.

At step 502 sequentially switching elements of the first SBG array into a diffracting state, all other elements being in their non-diffracting states;

At step 503 sequentially switching elements of the second SBG array into a diffracting state, all other elements being in their non-diffracting states;

At step 504 each diffracting SBG element of the first SBG array diffracting incident first TIR light upwards into a first optical path, At step 505 the transmission grating diffracting the first optical path light upwards into a second optical path, At step 506 a portion of the second optical path light incident at the point on the platen being transmitted out of the platen and light incident on the outer surface of the platen in the absence of said contact with an external material being reflected downwards in a third optical path, said third optical path traversing said cores, At step 508 an active SBG element of the second SBG array along the third optical path diffracting the third angle light downwards into a fourth optical path, At step 508 the fourth optical path light being reflected upwards into a fifth optical path at the third substrate, the fifth optical path light exceeding the critical angle set by the core/clad interface and the critical angle set by one of the core/second SBG array or second SBG array/third substrate interfaces, and proceeding along a TIR path to the detector.

In one embodiment of the invention the first to fifth optical paths in the method of FIG. 14 lie in a plane orthogonal to the first SBG array.

In one embodiment of the invention the method of FIG. 14 further comprises the step of providing a transparent slab of index lower than the third transparent substrate disposed between the third substrate and the transmission grating, such that the fourth optical path light is reflected upwards at the substrate into a fifth optical path and the fifth optical path light exceeds the critical angle set by the core/clad interface and the critical angle set by one of the core/second SBG array, second SBG array/third substrate or third substrate/ slab interfaces, providing a TIR path to the detector.

Figure 15:
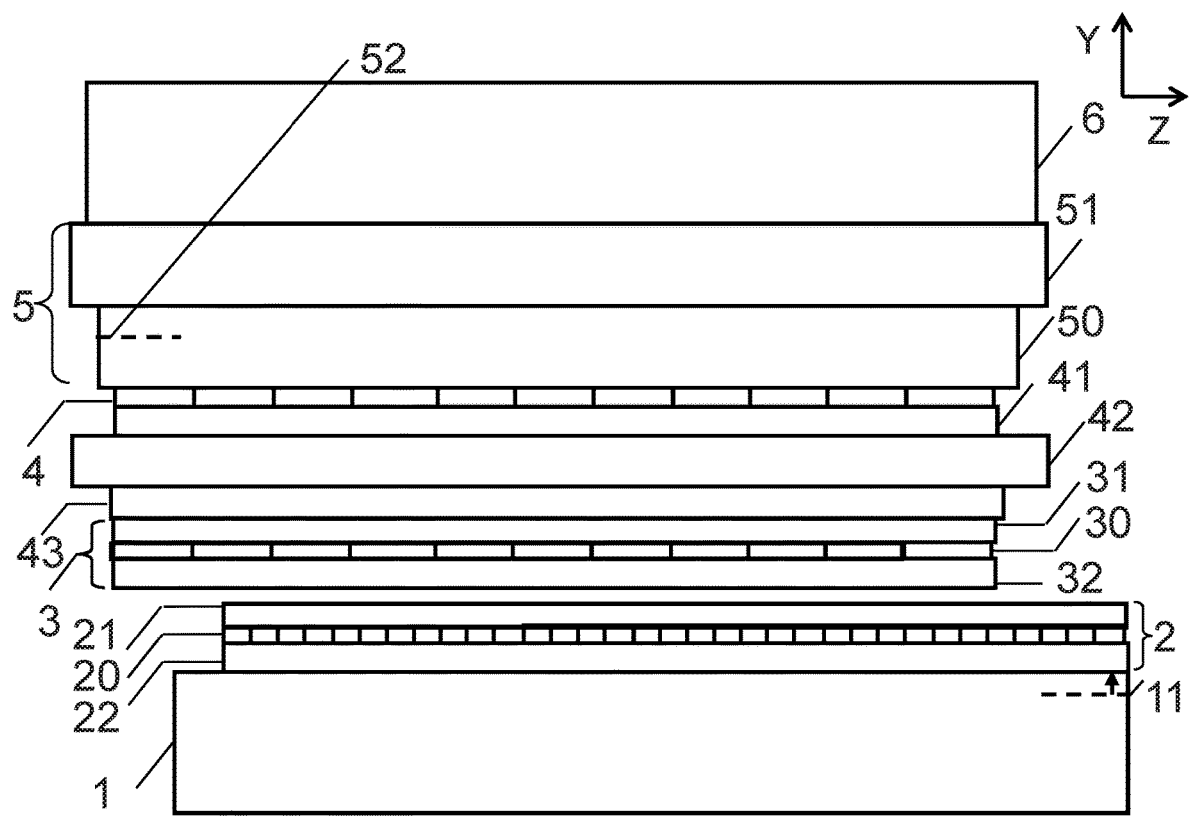
FIG. 15 is a schematic side elevation view of a contact image sensor in one embodiment of the invention.
Figure 17:
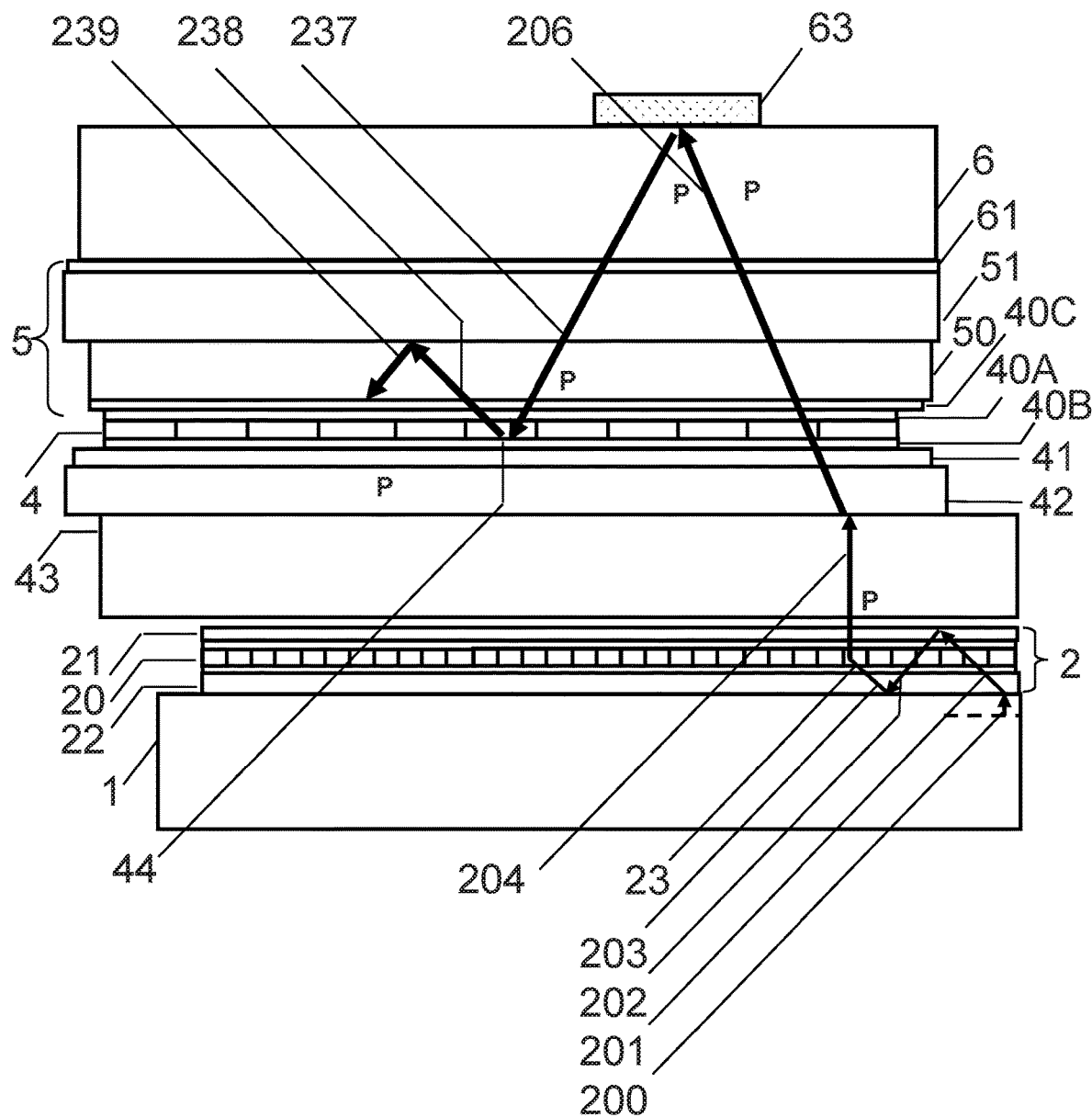
FIG. 17 is a schematic side elevation view of a contact image sensor in one embodiment of the invention.

In one embodiment of the invention illustrated in FIG. 17 there is provided a means for contact imaging of an object that emits light of a second wavelength when illuminated by light of a first wavelength. The apparatus of FIG. 17 is identical to the sensor FIG. 4 except that in FIG. 17 the rays 237,238,239 which replace the ray 207,208,209 of FIG. 4 now correspond to second wavelength light emitted from the object 63 which is in contact with the platen and illuminated by first wavelength light 206. In one embodiment of the invention the object 63 may be a fluorescent material excited by UV radiation. The ray 243 which replaces the ray 223 of FIG. 4 again represents a stray light path. It should be noted that the embodiment of FIG. 15 will required a more intense light source to compensate for the low coupling efficiency of the second wavelength light into the detector waveguide. The reason for this is that the light emitted from the object 61 will tend to be diffuse and unpolarized (in contrast to the situation in FIG. 4 where the downgrade light from the platen will be collimated and will retain the incident light polarization and collimation).

Figure 16:
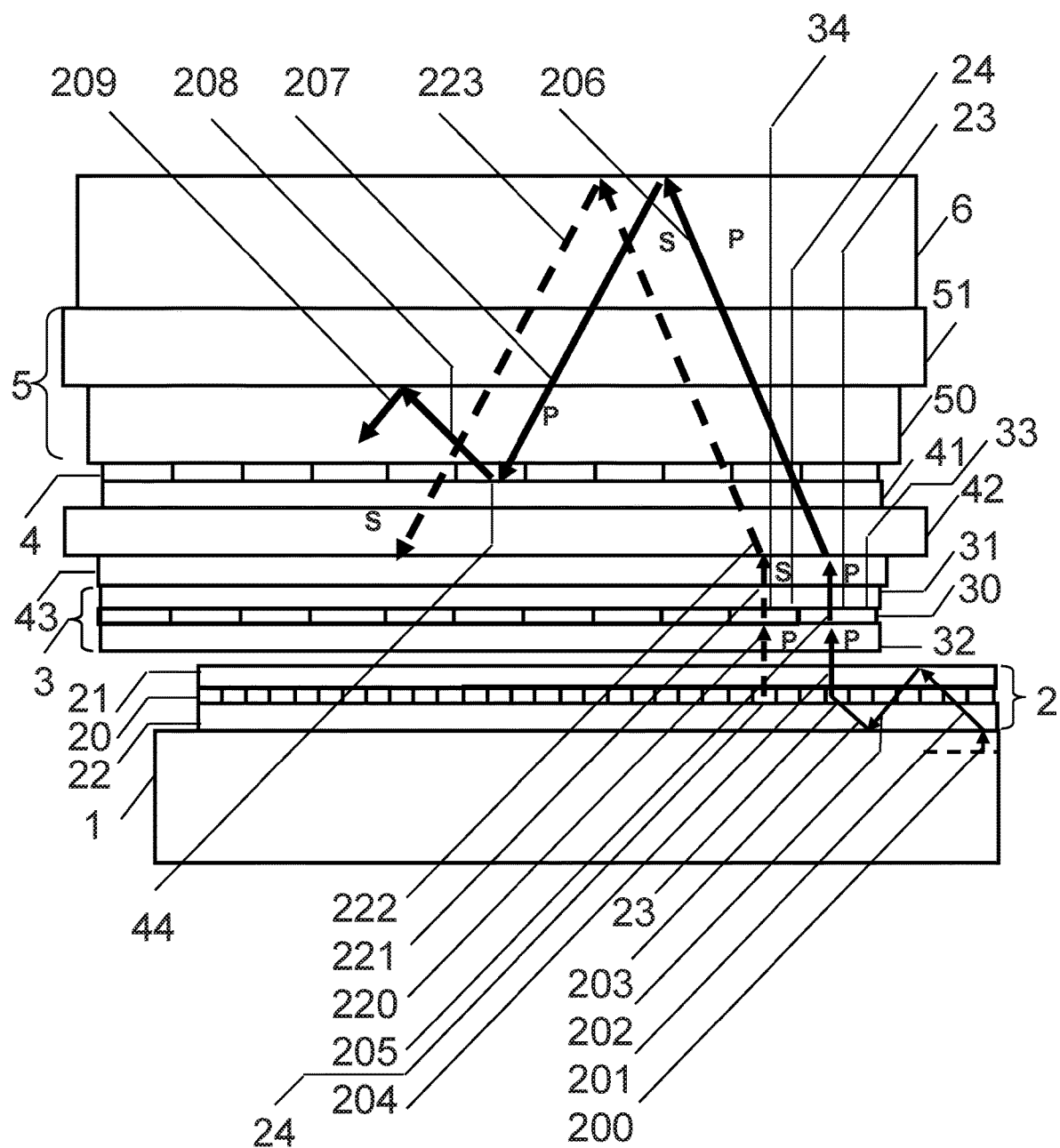
FIG. 16 is a schematic side elevation view of a contact image sensor in one embodiment of the invention showing the principle ray paths.

A contact image sensor according to the principles of the invention is illustrated in the schematic side elevation view of FIG. 16. The apparatus is identical to that of FIG. 1 but further comprises a half wave retarder array 3 disposed between the air gap 23 and the transmission grating 43. The half wave retarder array 3 comprises an array of column-shaped elements 30 sandwiched by transparent substrates 31,32. Each retarder element in the half wave retarder array is switchable between a polarization rotating state in which it rotates the polarization of incident light through ninety degrees and a non-polarization rotating state.

The column elements of the half wave retarder array have longer dimensions disposed parallel to the Y-axis ie orthogonally to the first TIR beam direction. Each half wave retarder array element overlaps at least one strip element of the first SBG array. At any time one element of the first SBG array is in a diffracting state and is overlapped by an element of the half wave retarder array in its non-polarization rotating state, one element of the second SBG array is in a diffracting state, all other elements of the first and second SBG arrays are in a non-diffracting state and all other elements of the half wave retarder array are in their polarization rotating states.

The function of the half wave retarder array is to control stray light such as that indicated by the ray 220 which is diffracted by the residual refractive index modulation of the element 24. The switchable half wave retarder array solves the problem of background leakage noise by converting unwanted light at source into S-polarized light. The active (i.e., diffracting) SBG column element 23 diffracts light 204 out of the light guide through the element 33 of the half wave retarder array 30 array as light 205. Since the element 33 is in its non-polarization rotating state the light 205 remains P-polarized. Note that all other elements of the half wave retarder array are in their polarization rotating states. The diffracted ray 220 is transmitted through the half wave retarder element 34 which is in its polarization rotating state such that the P-polarized light 220 is converted into S-polarized light 221. The ray 221 is next diffracted into the ray 222 by the transmission grating 43. The ray 223 is reflected off the platen/air interface into a downwards path as the ray 223. Since the ray 223 is S-polarized it is not diffracted by the second SBG and is therefore not coupled into the waveguide path to the detector. In one embodiment of the invention the light 223 propagates downwards though the stack of optical layers until it emerges from the bottom of the illuminator means 1 and is absorbed by a light-trapping means which is not illustrated. Typically, the light-trapping means would be an absorber. Other means for disposing of light of the type represented by the ray 223 will be apparent to those skilled in the art of optical design. The invention does not assume any particular means for disposing of such stray light.

An Embodiment of the Invention Using a SBG Waveguiding Structure

One embodiment of the invention uses a SBG waveguiding structure. Referring again to the embodiment of FIG. 1 the SBG waveguiding structure replaces the second SBG array 4 and the waveguiding 5 with a single SBG array devices which combines the functions of the SBG array 4 and the waveguiding layer. The relevant layers of FIG. 1 are contained within the dashed line box and correspond to the DETECTOR module of the sensor. The other modules are the PLATEN and the SCANNER which comprises the illuminator module 1 and the first SBG array device 2. The DETECTOR module in the alternative embodiment is now discussed with reference to FIGS. 21-26.

The contact sensor comprises the following parallel optical layers configured as a stack: an illumination means for providing a collimated beam of first polarization light; a first SBG array device further comprising first and second transparent substrates sandwiching an array of selectively switchable SBG column, and transparent electrodes applied to opposing faces of the SBG substrates together providing a first TIR light guide for transmitting light in a first TIR beam direction; and a transmission grating; and a platen as illustrated in FIG. 1 but which are not show in FIGS. 21-26.

Figure 21:
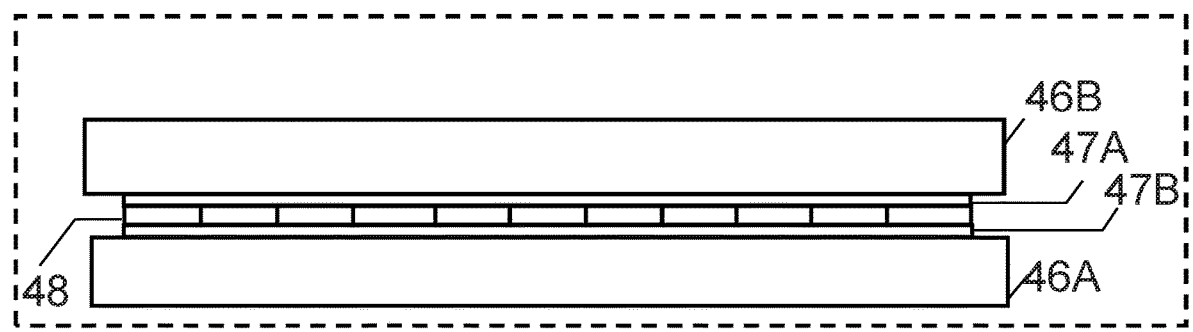
FIG. 21 is a schematic cross sectional view of a SBG waveguide device for coupling light reflected from the platen to a detector in one embodiment.
Figure 22:
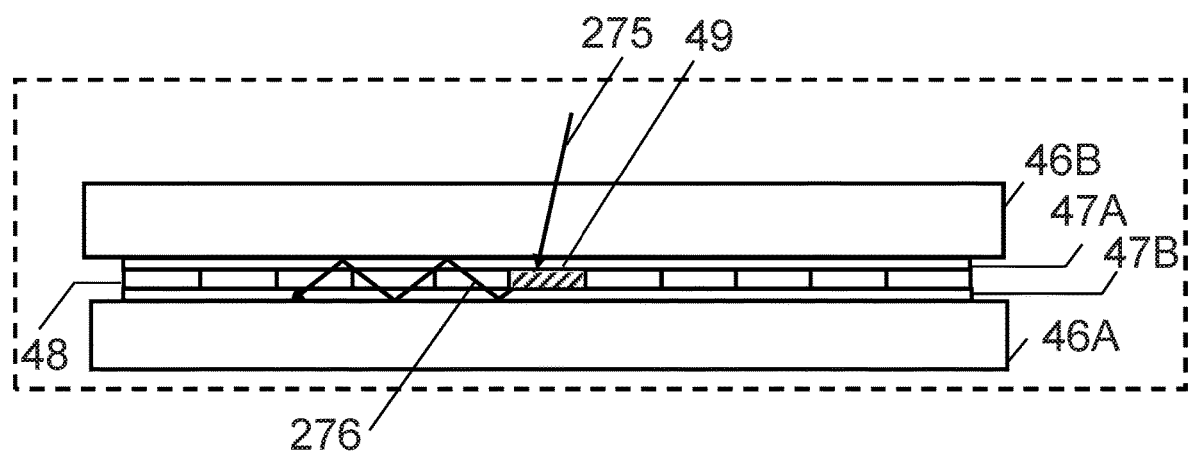
FIG. 22 is a schematic cross sectional view of a SBG waveguide device for coupling light reflected from the platen to a detector in one operational state in one embodiment.
Figure 23:
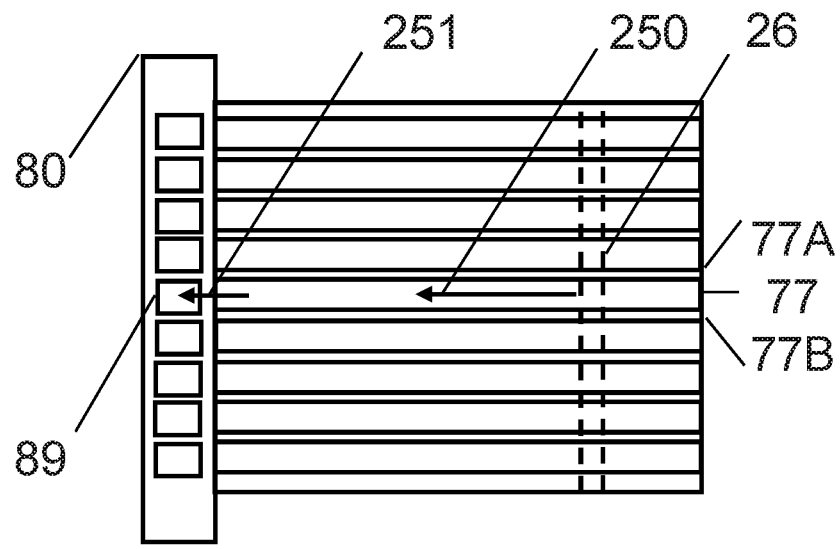
FIG. 23 is a schematic plan view of the embodiment of FIG. 22.
Figure 24:
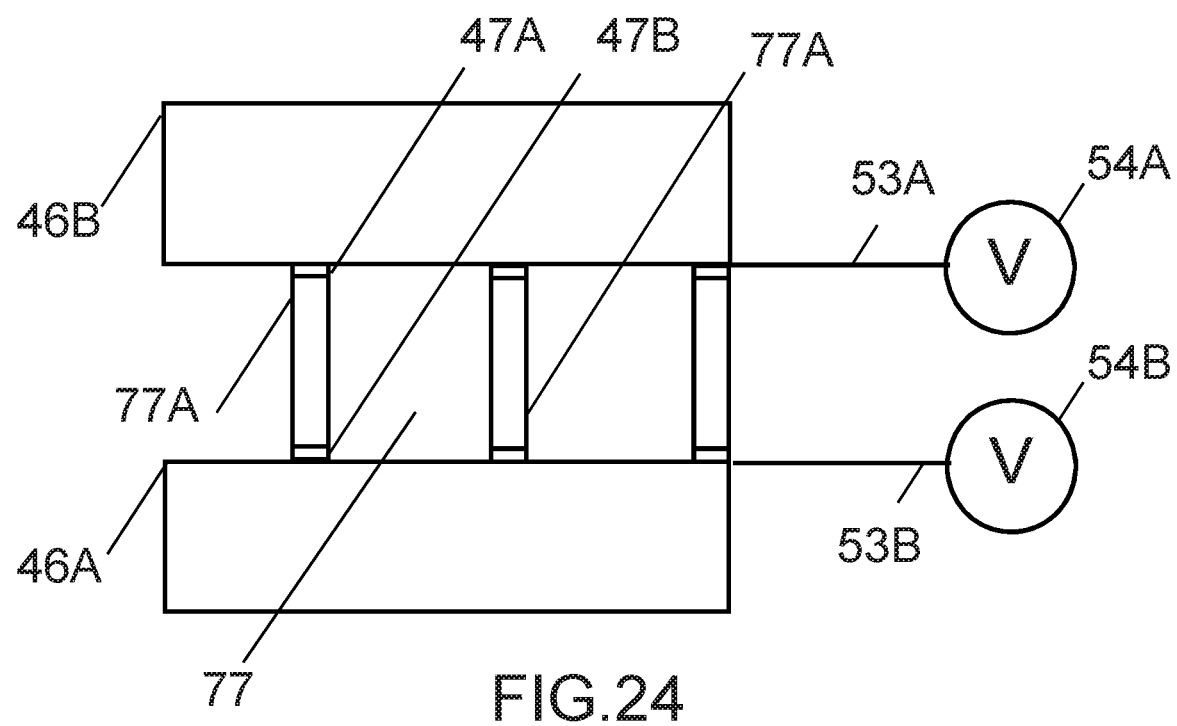
FIG. 24 is a schematic cross section view showing high index HPDLC cores and low index HPDLC cladding regions in the embodiment of FIG. 22.
Figure 25:
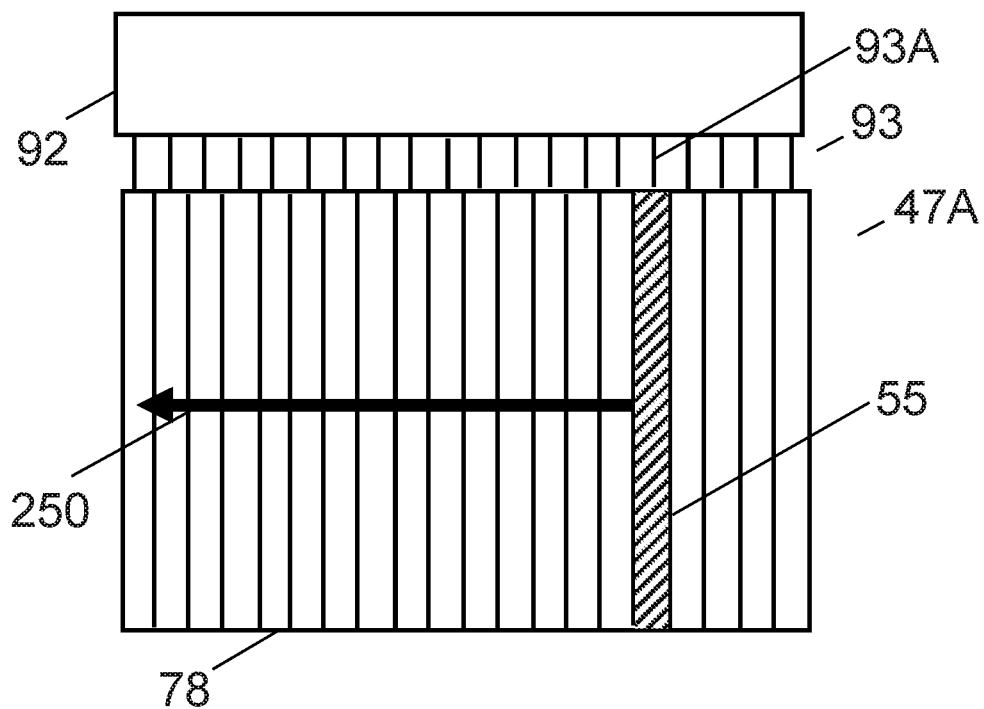
FIG. 25 is a plan view of column electrodes used in the embodiment of FIG. 22.
Figure 26:
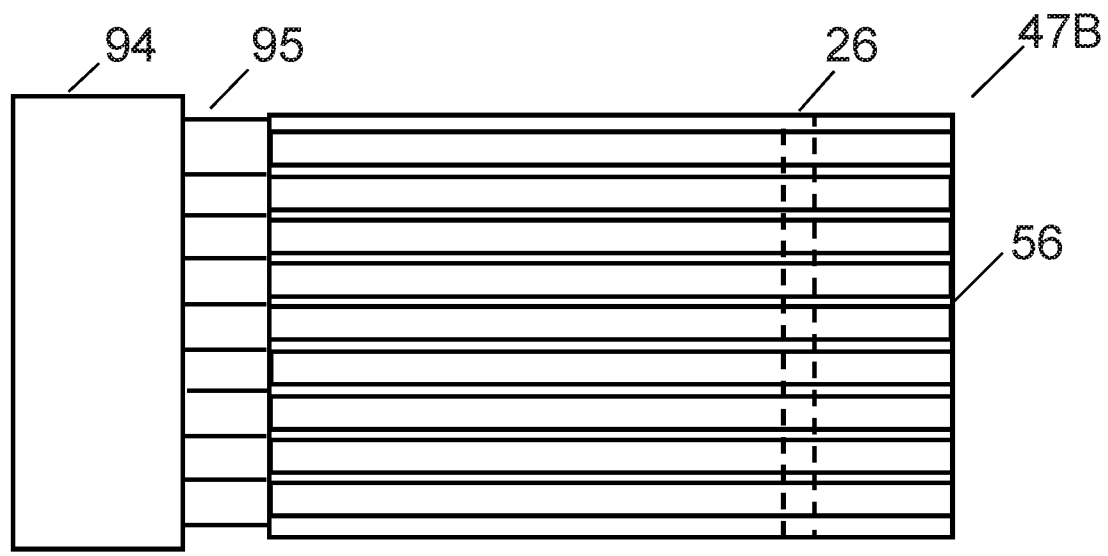
FIG. 26 is a plan view of row electrodes that overlap the low index HPDLC regions used in the embodiment of FIG. 22.

Turning to FIG. 21, we see that the second SBG array device further comprises transparent substrates 46A,46B sandwiching the SBG layer which is generally indicated by 48. The layer essentially consists of a multiplicity of high index HPDLC regions separated by low index HPDLC regions. Patterned transparent electrodes 47A,47B are applied to opposing faces of the substrates, as shown in FIG. 22. The high index regions provide waveguiding cores disposed parallel to the first beam direction generally indicated by 250, as shown in FIG. 23. The low index HPDLC regions provide waveguide cladding. The waveguide structure is shown in plan view in FIG. 23 which shows a waveguide core 77 and adjoining cladding regions 77A,77B. The waveguide structure is shown in cross section in FIG. 24. FIG. 24 shows electrodes 47A, 47B across a cladding region 77A. The adjacent core region is indicated by 77. Anti-phase voltages V1,V2 are applied to the upper and lower electrodes via connections 53A, 53B using the anti-phase voltage generators 54A,54B. The third and fourth substrate layers 46A, 46B have a generally lower refractive index than the cores and will typically match the indices of the cladding regions. The patterned electrodes applied to the third substrate comprise column shaped elements such as 55 in FIG. 25 defining a multiplicity of selectively switchable columns of SBG elements such as the one indicted by 26 which are aligned orthogonally to the waveguiding cores shown in FIG. 26. The patterned electrodes applied to the fourth substrate comprise elongate elements such as 56 overlapping the low index HPDLC regions. In some embodiments such as the one shown in FIG. 25 driver 92 is used to switch the column electrodes via the electrical connections generally indicated by 93. One connection 93A addresses the element 55. In some embodiments such as the one shown in FIG. 26 a further driver 94 is used to switch the row electrodes overlapping the low index HPDLC clad regions such as 56 via the electrical connections generally indicated by 95.

As in the embodiment of FIG. 1 the apparatus further comprises: means for coupling light from the illumination means into the first TIR light guide; means for coupling light out of the second SBG array device into an output optical path; and a detector 80 comprising at least one photosensitive element 89 in FIG. 23. The detector comprises an array of photosensitive elements, each photosensitive element being optically coupled to at least one waveguiding core. Each SBG element in the first and second SBG arrays is switchable between a diffracting state and a non-diffracting state with the SBG elements diffracting only first polarization light.

In one embodiment of the invention based on an SBG waveguiding structure the SBG operates in reverse mode such that the diffracting state exists when an electric field is applied across the SBG element and a non-diffracting state exists when no electric field is applied.

In one embodiment of the invention based on an SBG waveguiding structure the said diffracting state exists when no electric field is applied across the SBG element and said non diffracting states exists when an electric field is applied.

In one embodiment based on an SBG waveguiding structure of the invention at any time one element of the first SBG array is in a diffracting state, one element of the second SBG array is in a diffracting state, all other elements of the first and second are in a non-diffracting state.

In one embodiment of the invention based on an SBG waveguiding structure an active SBG element of the first SBG array in a diffracting state diffracts incident first TIR light upwards into a first beam direction. Referring to FIG. 22 which shows the alternative DETECTOR apparatus, light incident on the outer surface of the platen in the absence of external material is reflected downwards in a third optical path 275. The third optical path traverses the cores. An active column 49 of the second SBG array along the third beam direction diffracts the third angle light into a second TIR path 276 down the traversed core towards the detector. The first to third optical paths and the first and second TIR paths are in a common plane.

In one embodiment of the invention based on an SBG waveguiding structure the output from detector array element is read out in synchronism with the switching of the elements of the first SBG array.

In one embodiment of the invention based on an SBG waveguiding structure there is provided an air gap between the first SBG array and the transmission grating.

In one embodiment of the invention based on an SBG waveguiding structure there is provided a method of making a contact image measurement comprising the steps of:

i) providing an apparatus comprising the following parallel optical layers configured as a stack: an illumination means for providing a collimated beam of first polarization light; a first SBG array device further comprising first and second transparent substrates sandwiching an array of selectively switchable SBG column elements, and transparent electrodes applied to opposing faces of the substrates and the SBG substrates together providing a first TIR light guide for transmitting light in a first beam direction; a transmission grating; a transparent substrate; a second SBG array device further comprising third and fourth substrates sandwiching a multiplicity of high index HPDLC regions separated by low index HPDLC regions and patterned transparent electrodes applied to opposing faces of the substrates; a platen; and a detector; and further comprising: means for coupling light from the illumination means into the first TIR light guide; means for coupling light out of the second SBG array device into an output optical path; and a detector comprising at least one photosensitive element; the high index regions providing waveguiding cores disposed parallel to the first beam direction and the low index HPDLC regions providing waveguide cladding; the substrates layers having a generally lower refractive index than the cores, the patterned electrodes applied to the third substrate defining a multiplicity of selectively switchable columns orthogonal to the waveguiding cores and the patterned electrodes applied to the fourth substrate overlapping the low index HPDLC regions j) an external material contacting a point on the external surface of the platen;

k) sequentially switching elements of the first SBG array into a diffracting state, all other elements being in their non-diffracting states;

l) sequentially switching columns of the second SBG array device into a diffracting state, all other columns being in their non-diffracting states;

m) each diffracting SBG element of the first SBG array diffracting incident first TIR light upwards into a first optical path, n) the transmission grating diffracting the first optical path light upwards into a second optical path, o) a portion of the second optical path light incident at the point on the platen contacted by the external material being transmitted out of the platen, while portions of said second optical path light not incident at the point are reflected downwards in a third optical path, the third optical path traversing one core, p) an active SBG column element of the second SBG array along the third optical path diffracting the third angle light in a second TIR path down the traversed core and proceeding along a TIR path along the core to the detector.

Figure 27:
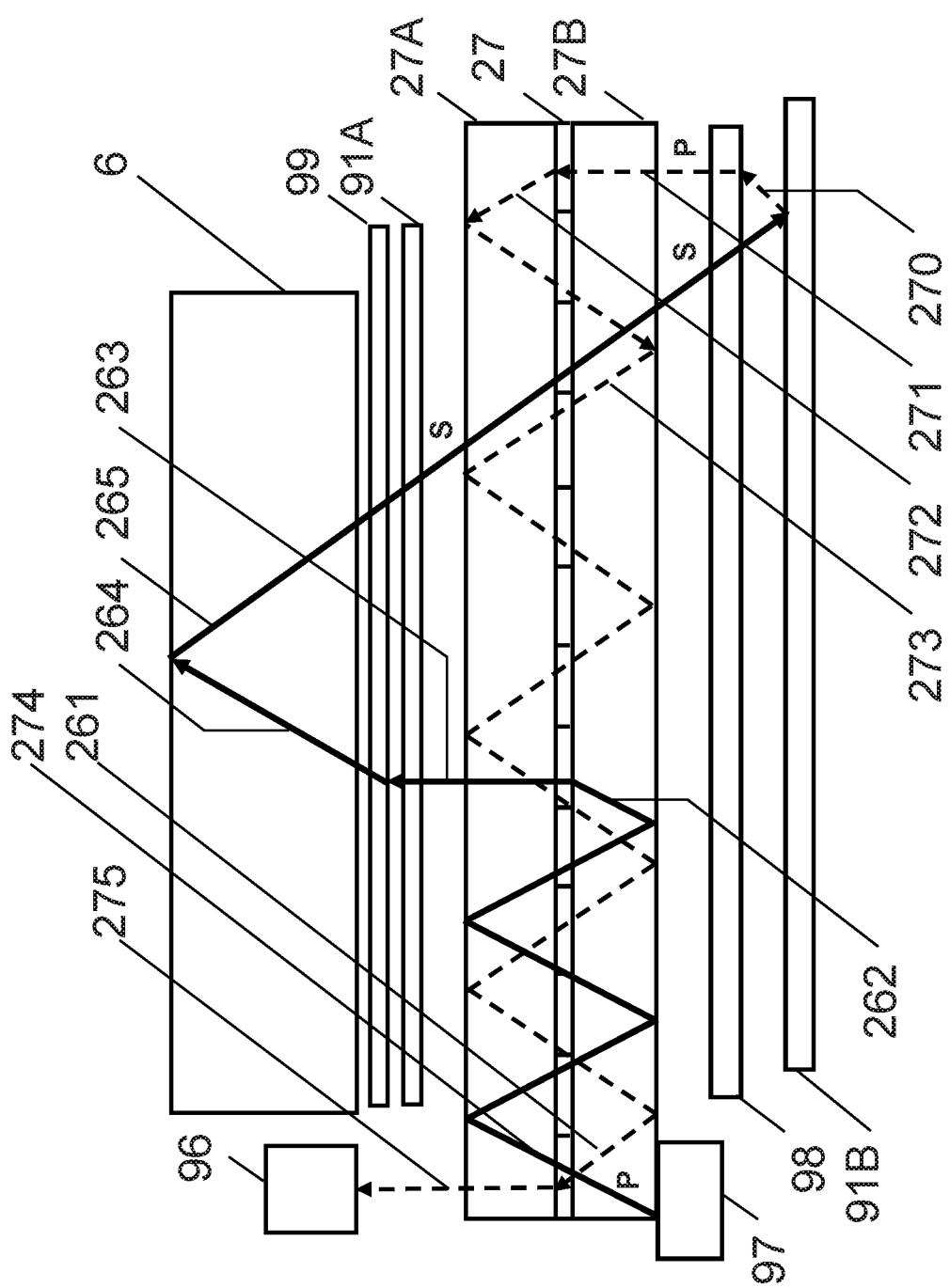
FIG. 27 is a schematic cross sectional view of a contact image sensor in one embodiment.

An Embodiment of the Invention Combining a Scanner and a Detector in a Single SBG Array In one embodiment of the invention, as shown in FIG. 27, there is provided a contact image sensor using a single SBG array layer comprising: an illumination means 97 for providing a collimated beam of first polarization light; an SBG array device further comprising first and second transparent substrates 27A,27B sandwiching an array of selectively switchable SBG columns 27, and transparent electrodes (not shown) applied to opposing faces of the substrates, said SBG substrates together providing a first TIR light guide for transmitting light in a first TIR beam direction; a first transmission grating layer 91B overlaying the lower substrate of the SBG array device; a second transmission grating layer 91A overlaying the upper substrates of the SBG array device; a quarter wavelength retarder layer 99 overlaying the second transmission grating layer; a platen 6 overlaying the quarter wavelength retarder layer; and a polarization rotating reflecting layer 98 overlaying the first transmission grating layer. The apparatus further comprises: means 97 for coupling light from said illumination means into said SBG array device; means 96 for coupling light out of the second SBG array device into an output optical path; and a detector (not illustrated) comprising at least one photosensitive element. The light path from the illumination means to the platen via a diffracting SBG column is illustrated by the solid line. The path of the reflected light from the platen to the detector means is shown as a dashed line.

In applications such as finger print sensing the illumination light is advantageously in the infrared. In one embodiment of the invention the laser emits light of wavelength 785 nm. However, the invention is not limited to any particular wavelength.

In fingerprint detection applications the invention may be used to perform any type "live scan" or more precisely any scan of any print ridge pattern made by a print scanner. A live scan can include, but is not limited to, a scan of a finger, a finger roll, a flat finger, a slap print of four fingers, a thumb print, a palm print, or a combination of fingers, such as, sets of fingers and/or thumbs from one or more hands or one or more palms disposed on a platen. In a live scan, for example, one or more fingers or palms from either a left hand or a right hand or both hands are placed on a platen of a scanner. Different types of print images are detected depending upon a particular application. A flat print consists of a fingerprint image of a digit (finger or thumb) pressed flat against the platen. A roll print consists of an image of a digit (finger or thumb) made while the digit (finger or thumb) is rolled from one side of the digit to another side of the digit over the surface of the platen. A slap print consists of an image of four flat fingers pressed flat against the platen. A palm print involves pressing all or part of a palm upon the platen.

The present invention essentially provides a solid state analogue of a mechanical scanner. The invention may be used in a portable fingerprint system which has the capability for the wireless transmission of fingerprint images captured in the field to a central facility for identity verification using an automated fingerprint identification system.

It should be emphasized that the drawings are exemplary and that the dimensions have been exaggerated.

It should be understood by those skilled in the art that while the present invention has been described with reference to exemplary embodiments, it is to be understood that the invention is not limited to the disclosed exemplary embodiments. Various modifications, combinations, sub-combinations and alterations may occur depending on design requirements and other factors insofar as they are within the scope of the appended claims or the equivalents thereof.

What is claimed is:

1. An imaging sensor comprising:
a source of light for illuminating an object;
an array of switchable grating elements;
a plurality of detector elements; and
a plurality of cores optically coupled to said array of switchable grating elements, each core comprising a high index region adjacent a low index region for waveguiding light reflected by said object onto said array towards a unique detector element,
wherein said imaging sensor is configured to perform a sequence of switching steps, wherein in each step at least one grating element is switched into a diffracting state to direct light reflected from said object towards at least one of said detector elements via at least one of said cores with all other grating elements remain in their non-diffracting states.

2. The imaging sensor of claim 1, wherein said array of switchable grating elements is configured to couple light from said source towards said object, wherein in each said switching step one grating element is switched into a diffracting state to direct light towards said object, one grating element is switched into a diffracting state to direct light reflected from said object towards at least one of said detector elements via at least one of said cores, and all other grating elements remain in their non-diffracting states.

3. The imaging sensor of claim 1, wherein said plurality of detector elements is spatially distributed in two dimensions.

4. The imaging sensor of claim 1, wherein each said grating element is switchable between a diffracting state and a non-diffracting state.

5. The imaging sensor of claim 1, wherein said plurality of cores comprises:
   high refractive index strips separated by low refractive index cladding material; or
   regions of high refractive index HPDLC material separated by regions of low refractive index HPDLC material.

6. The imaging sensor of claim 1, wherein said plurality of cores is formed within a layer containing said array of switchable prating elements or formed within a layer overlapping said of switchable grating elements.

7. The imaging sensor of claim 1, wherein said switchable grating elements have refractive index modulation varying along the length of said array.

8. The imaging sensor of claim 1 wherein, light in each of said cores is coupled to one of said plurality of detector elements by a grating or a prism.

9. The imaging sensor of claim 1, wherein said switchable grating elements are switched in their array order.

10. The imaging sensor of claim 1, wherein an output signal from said plurality of detector elements is read out in synchronism with the switching of said switchable grating elements.

11. The imaging sensor of claim 1, wherein said diffracting state exists when an electric field is applied across said switchable grating elements and said non-diffracting state exists when no electric field is applied.

12. The imaging sensor of claim 1, wherein said diffracting state exists when no electric field is applied across said switchable grating elements and said non-diffracting state exists when an electric field is applied.

13. The imaging sensor of claim 1, further comprising at least one element selected from the group of an air space, a polarization modifying layer, a diffractive optical element and a homogeneous refractive index material layer, a microlens array and a low index material layer, and a platen for contact imaging of said object.

14. The imaging sensor of claim 1, wherein said source comprises at least one selected from the group of a laser, a light emitting diode and a collimator lens.

15. The imaging sensor of claim 1, wherein said light is coupled into said switchable grating array via a grating or a prismatic element.

16. The imaging sensor of claim 1, wherein each said array of switchable grating elements is formed in a layer sandwiched by transparent substrates, said substrates supporting transparent electrodes, and said substrates together providing a total internal reflection light guide.

17. The imaging sensor of claim 1, wherein each of said switchable grating elements are selected from the group of: switchable Bragg gratings (SBGs), gratings recorded in liquid crystal and polymer material system, gratings recorded in a holographic polymer dispersed liquid crystal material system, and gratings recorded in a reverse mode holographic polymer dispersed liquid crystal material system.

18. The imaging sensor of claim 1, wherein said cores include at least one selected from the group of: curved core segments in proximity to said detector elements and core segments disposed between adjacent detector elements.

19. The imaging sensor of claim 16, wherein said switchable grating elements are elongated with a longer dimension perpendicular to a principal beam propagation direction of said light guide.

20. A method of making a contact image measurement, comprising the steps of:
   providing:
      a source of light for illuminating an object;
      an array of switchable grating elements;
      a plurality of detector elements; and
      a plurality of cores optically coupled to said array of switchable grating elements, each core comprising a high index region adjacent a low index region for waveguiding light reflected by said object onto said array towards a unique detector element;
   illuminating said object with light from said source;
   switching one grating element in said array of switchable grating elements into its diffracting state with all other elements remaining in their nondiffracting states:
   diffracting light reflected from said object onto at least one of said cores using said array of switchable grating elements; and
   transmitting waveguided light coupled into at least one of said cores towards at least one of said detector elements.

* * * * *